(12) United States Patent
Mirkin et al.

(10) Patent No.: US 9,372,397 B2
(45) Date of Patent: Jun. 21, 2016

(54) POLYMER PEN LITHOGRAPHY

(75) Inventors: Chad A. Mirkin, Wilmette, IL (US);
Fengwei Huo, Evanston, IL (US); Zijian Zheng, Hong Kong (CN); Gengfeng Zheng, Ambler, PA (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 1264 days.

(21) Appl. No.: 12/989,279

(22) PCT Filed: Apr. 25, 2009

(86) PCT No.: PCT/US2009/041738
§ 371 (c)(1),
(2), (4) Date: Jan. 21, 2011

(87) PCT Pub. No.: WO2009/132321
PCT Pub. Date: Oct. 29, 2009

(65) Prior Publication Data
US 2011/0132220 A1    Jun. 9, 2011

Related U.S. Application Data

(60) Provisional application No. 61/047,910, filed on Apr. 25, 2008, provisional application No. 61/049,679, filed on May 1, 2008, provisional application No. 61/076,199, filed on Jun. 27, 2008.

(51) Int. Cl.
*G03F 7/00*      (2006.01)
*B82Y 10/00*    (2011.01)
*B82Y 40/00*    (2011.01)

(52) U.S. Cl.
CPC ............... *G03F 7/0002* (2013.01); *B82Y 10/00* (2013.01); *B82Y 40/00* (2013.01)

(58) Field of Classification Search
CPC ....................................................... G03F 7/0002
USPC ................................................. 101/485, 483
See application file for complete search history.

(56) References Cited

U.S. PATENT DOCUMENTS 5,472,881 A    12/1995   Beebe et al.
5,776,748 A    7/1998    Singhvi et al.
(Continued)

FOREIGN PATENT DOCUMENTS

WO      WO-99/48682 A1    9/1999
WO      WO-2005/115630 A2   12/2005
(Continued)

OTHER PUBLICATIONS

Hong et al., "A micromachined elastomeric tip array for contact printing with variable dot size and density", J. Micromech. Microeng. 18 (2008) 015003 (6pp), Published Nov. 28, 2007.*
(Continued)

*Primary Examiner* — Jennifer Simmons
(74) *Attorney, Agent, or Firm* — Marshall, Gerstein & Borun LLP

(57) ABSTRACT

The disclosure relates to methods of printing indicia on a substrate using a tip array comprised of elastomeric, compressible polymers. The tip array can be prepared using conventional photolithographic methods and can be tailored to have any desired number and/or arrangement of tips. Numerous copies (e.g., greater than 15,000, or greater than 11 million) of a pattern can be made in a parallel fashion in as little as 40 minutes.

32 Claims, 8 Drawing Sheets

(56) References Cited

U.S. PATENT DOCUMENTS

| | | | |
|---|---|---|---|
| 5,846,909 A | | 12/1998 | McDevitt et al. |
| 5,908,692 A | | 6/1999 | Hamers et al. |
| 5,942,397 A | | 8/1999 | Tarlov et al. |
| 6,304,364 B1 | * | 10/2001 | Qin .................... B82Y 10/00 345/108 |
| 6,339,217 B1 | * | 1/2002 | Kley ............................ 250/216 |
| 6,500,549 B1 | | 12/2002 | Deppisch et al. |
| 6,596,346 B2 | | 7/2003 | Bernard et al. |
| 6,635,311 B1 | | 10/2003 | Mirkin et al. |
| 7,265,188 B2 | * | 9/2007 | Autran ......................... 525/439 |
| 7,491,422 B2 | | 2/2009 | Zhang et al. |
| 2002/0063212 A1 | * | 5/2002 | Mirkin et al. ................ 250/306 |
| 2004/0228962 A1 | | 11/2004 | Liu et al. |
| 2006/0047073 A1 | * | 3/2006 | Inoue .......................... 525/191 |
| 2006/0198422 A1 | * | 9/2006 | Chopra et al. ................ 374/158 |
| 2007/0008390 A1 | | 1/2007 | Cruchon-Dupeyrat et al. |
| 2007/0269747 A1 | | 11/2007 | Bahadur et al. |
| 2008/0105042 A1 | | 5/2008 | Mirkin et al. |
| 2008/0309688 A1 | | 12/2008 | Haaheim et al. |
| 2009/0205091 A1 | | 8/2009 | Haaheim et al. |

FOREIGN PATENT DOCUMENTS

| | | |
|---|---|---|
| WO | WO-2007/126689 A1 | 11/2007 |
| WO | WO-2009/132321 A1 | 10/2009 |
| WO | WO-2010/096591 A2 | 8/2010 |
| WO | WO-2010/096593 A2 | 8/2010 |

OTHER PUBLICATIONS

Trimbach et al., "Block Copolymer Thermoplastic Elastomers for Microcontact Printing", Langmuir 2003, 19, 10957-10961, Oct. 13, 2003.*
Rosner et al., Functional extensions of Dip Pen Nanolithography™: active probes and microfluidic i2854k delivery, Smart Mater. Struct., 15:S124-30 (2006).
Dammel, Diazonaphthoquinone-based Resists, 1st ed., SPIE Optical Engineering Press, Bellingham, Wash. (1993).
Li et al., Self-assembly of n-alkanethiolate monolayers on silver nano-structures: determination of the apparent thickness of the monolayer by scanning tunneling microscopy, Technical Report No. 2, Office of Naval Research, 24 pp (1994).
Magallon et al., Structural characterization of n-alkyl amine monolayers on copper by ellipsometry and infrared spectroscopy, IN: Book of Abstracts of 215th ACS National Meeting, Dallas, Texas, Mar. 29-Apr. 2, 1998, Abstract No. 048.
Ohno et al., Nanostructural formation of self-assembled monolayer films on cleaved AlGaAs/GaAs heterojuctions, Mol. Crystal Liq. Crystal Sci. Technol. A, 295:189-92 (1997).
Reuter et al., Effects of gallium arsenide passivation on scanning tunneling microscope excited luminescence, IN: Mater. Res. Soc. Symposium Proceedings, 380:119-24 (1995).
Sangiorgi et al., Adsorption of 1-decylamine on copper, Gazz. Chim. Ital., 111: 99-102 (1981).
Solomun et al., On the promoting effect of alkali metals on the adsorption of nitriles on the gold(100) surface, Ber. Bunsen-Ges. Phys. Chem., 95:95-8 (1991).
Solomun et al., The interaction of nitriles with a potassium-promoted gold(100) surface, J. Phys. Chem., 95:10041-9 (1991).
Song, Quenching of porous silicon photoluminescence by aromatic molecules, and surface derivatization of porous silicon with dimethyl sulfoxide, aryllithium, or alkyllithium reagents, Doctor of Philosophy in ChemistryThesis, University of California at San Diego (1998).
Chidsey, Molecular chemistry of silicon surfaces and the formation of covalently bonded organic monolayers, IN: Book of Abstracts of the 214th ACS National Meeting, Las Vegas, Nev., Sep. 7-11, 1997, Abstract No. 027.
Fragala et al., Enabling the desktop NanoFab with DPN® pen and ink delivery systems, MRS Proceedings, vol. 1037, 8 pages (2007).

Allara et al., Spontaneously organized molecular assemblies. 1. Formation, dynamics and physical properties of n-Alkanoic acids adsorbed from solution on an oxidized aluminum surface, Langmuir, 1: 45 (1985).
Allara et al., The study of the gas-solid interaction of acetic acid with a cuprous oxide surface using reflection-absorption spectroscopy, J. Colloid Interface Sci., 49: 410-21 (1974).
Anwander et al., Surface characterization and functionalization of MCM-41 silicas via silazane silylation, J. Phys. Chem. B, 104:3532-44 (2000).
Bain et al., A new class of self-assembled monolayers: organic thiols on gallium arsenide, Adv. Mater., 4:591-4 (1992).
Bansal et al., Electrochemical properties of (111)-oriented n-Si surfaces derivatized with covalently-attached alkyl chains, J. Phys. Chem. B, 102:1067-70 (1998).
Bansal et al., Stabilization of Si photoanodes in aqueous electrolytes through surface alkylation, J. Phys. Chem. B., 102:4058-60 (1998).
Bernard et al., Printing patterns of proteins, Langmuir, 14:2225-9 (1998).
Bishop et al., Self-assembled monolayers: Recent developments and applications, Curr. Opin. Colloid & Interface Sci., 1:127-36 (1996).
Brazdil et al. Resonance raman spectra of adsorbed species at solid-gas interfaces. 2. ρ-Nitrosodimethylaniline and ρ-Dimethylaminoazobenzene adsorbed on semiconductor oxide surfaces, J. Phys. Chem., 85, 1005-14 (1981).
Burwell Modified silica gels as adsorbents and catalysts, Chem. Technol., 4, 370-7 (1974).
Calvert, Lithographic patterning of self-assembled films, J. Vac. Sci. Technol. B, 11:2155 (1993).
Chang et al., Structures of self-assembled monolayers of aromatic-derivatized thiols on evaporated gold and silver surfaces: implication on packing mechanism, J. Am. Chem. Soc., 116, 6792-805 (1994).
Chen et al., Do alkanethiols adsorb onto the surfaces of Ti—Ba—Ca—Cu—O-based high-temperature superconductors? The critical role of $H_2O$ content on the adsorption process, Langmuir, 12:2622-4 (1996).
Chen et al., Regiocontrolled synthesis of poly(3-alkylthiophenes) mediated by rieke zinc: their characterization and solid-state properties, J. Am. Chem. Soc., 117:233-44 (1995).
Chen et al., Synthesis and characterization of carboxylate-modified gold nanoparticle powders dispersible in water, Langmuir, 15:1075-82 (1999).
Chou et al., Imprint lithography with 25-nanometer resolution, Science, 272:85-7 (1996).
Delamarche et al., Microcontact printing using poly(dimethylsiloxane) stamps hydrophilized by poly(ethylene oxide) silanes, Langmuir, 19:8749 (2003).
Demers et al., Direct patterning of modified oligonucleotides on metals and insulators by dip-pen nanolithography, Science, 296:1836-8 (2002).
Donzel et al., Hydrophilic poly(dimethylsiloxane) stamps for microcontact printing, Adv. Mater., 13:1164-7 (2001).
Dubois et al., Synthesis, structure, and properties of model organic surfaces, Phys. Chem., 43:437-63 (1992).
Ellison et al., Adsorption of phenyl isothiocyanate on Si(001): A 1,2-dipolar surface addition reaction, J. Phys. Chem. B, 103:6243-51 (1999).
Ellison et al., Cycloaddition chemistry on silicon(001) surfaces: The adsorption of azo-tert-butane, J. Phys. Chem. B, 102:8510-8 (1998).
Eltekova et al., Adsorption of aromatic compounds from solutions on titanium dioxide and silica, Langmuir, 3:951-7 (1987).
Fenter et al., Structure of CH3(CH2)17SH self-assembled on the Ag(111) surface: an incommensurate monolayer, Langmuir, 7, 2013-16 (1991).
Gates et al., New approaches to nanofabrication: molding, printing, and other techniques, Chem. Rev., 105:1171-96 (2005).
Geissler et al., Patterning: principles and some new developments, Adv. Mater., 16:1249-69 (2004).
Ginger et al., The evolution of dip-pen nanolithography, Angew. Chem. Int. Ed. Engl., 43:30-45 (2004).
Grabar et al., Preparation and characterization of Au colloid monolayers, Anal Chem, 67 : 735-43 (1995).

(56) References Cited

OTHER PUBLICATIONS

Gu et al., Electron tunneling at the semiconductor-insulator-electrolyte interface. Photocurrent studies of the n-InP-alkanethiol-ferrocyanide system, *J. Phys. Chem. B*, 102:9015-28 (1998).
Gui et al., Adsorption and surface structural chemistry of thiophenol, benzyl mercaptan, and alkyl mercaptans. Comparative studies at Ag(111) and Pt(111) electrodes by means of auger spectroscopy, electron energy loss spectroscopy, low-energy election diffraction, and electrochemistry, *Langmuir*, 7, 955-63 (1991).
Hamers et al., Formation of ordered, anisotropic organic monolayers on the Si(001) surface, *J Phys. Chem. B*, 101:1489-92 (1997).
He et al., Preparation of hydrophilic poly(dimethylsiloxane) stamps by plasma-induced grafting, *Langmuir*, 19:6982-6 (2003).
Henderson et al., Self-assembled monolayers of ithiols, diisocyanides, and isocyanothiols on gold: "chemically sticky" surfaces for covalent attachment of metal clusters and studies of interfacial electron transfer, *Inorg. Chim. Acta*, 242:115-24 (1996).
Hickman et al., Combining spontaneous molecular assembly with microfabrication to pattern surfaces: selective binding of isonitriles to platinum microwires and characterization by electrochemistry and surface spectroscopy, *J. Am. Chem. Soc.*, 111: 7271-7272 (1989).
Hickman et al., Toward orthogonal self-assembly of redox active molecules on Pt and Au: selective reaction of disulfide with Au and isocyanide with Pt, *Langmuir*, 8, 357-9 (1992).
Hong et al., A nanoplotter with both parallel and serial writing capabilities, *Science*, 288:1808-11 (2000).
Hovis et al., Cycloaddition chemistry and formation of ordered organic monolayers on silicon (001) surfaces, *Surf. Sci.*, 402-404:1-7 (1998).
Hovis et al., Cycloaddition chemistry of 1,3-dienes on the silicon(001) surface: competition between [4+2] and [2+2] reactions, *J. Phys. Chem. B*, 102:6873-9 (1998).
Hovis et al., Structure and bonding of ordered organic monolayers of 1,5-cyclooctadiene on the silicon(001) surface, *J. Phys. Chem. B*, 101:9581-5 (1997).
Hubbard, Electrochemistry of well-defined surfaces, *Acc. Chem. Res.*, 13:177-84 (1980).
Huc et al., Self-assembled mono- and multilayers on gold from 1,4-diisocyanobenzene and ruthenium phthalocyanine, *J. Phys. Chem. B*, 103: 10489-95 (1999).
Iler, *The Chemistry of Silica*, Chapter 6, New York: Wiley (1979).
International Search Report and Written Opinion for corresponding International Application No. PCT/US09/41738, dated Jun. 30, 2009.
International Preliminary Report on Patentability for corresponding International Application No. PCT/US09/41738, dated Oct. 26, 2010.
Ito et al., Pushing the limits of lithography, *Nature*, 406:1027-31 (2000).
James et al., Patterned protein layers on solid substrates by thin stamp microcontact printing, *Langmuir*, 14, 741-4 (1998).
Kramer et al., Scanning probe lithography using self-assembled monolayers, *Chem. Rev.*, 103:4367-418 (2003).
Kumar et al., Features of gold having micrometer to centimeter dimensions can be formed through a combination of stamping with an elastomeric stamp and an alkanethiol "ink" followed by chemical etching, *Appl. Phys. Lett.*, 63:2002 (1993).
Laibinis et al., ω-Terminated alkanethiolate monolayers on surfaces of copper, silver, and gold have similar wettabilities, *J. Am. Chem. Soc.*, 114, 1990-5 (1992).
Laibinis et al., Comparisons of self-assembled monolayers on silver and gold: mixed monolayers derived from $HS(CH_2)_{21}$ X and $HS(CH_2)_{10}$ Y (X, Y = $CH_3$, $CH_2$ OH) have similar properties, *Langmuir*, 7:3167-73 (1991).
Lee et al., Adsorption of ordered zirconium phosphonate multilayer films on silicon and gold surfaces, *J. Phys. Chem.*, 92 : 2597-601 (1988).
Lee et al., Protein nanoarrays generated by dip-pen nanolithography, *Science*, 295:1702-5 (2002).
Lenhert et al., Massively parallel dip-pen nanolithography of heterogeneous supported phospholipid multilayer patterns, *Small*, 3:71-5 (2007).
Li et al., Self-assembly of *n*-alkanethiolate monolayers on silver nanostructures: determination of the apparent thickness of the monolayer by scanning tunneling microscopy, *J. Phys. Chem.*, 98, 11751-5 (1994).
Lo et al., Polypyrrole growth on $YBa_2$ $Cu_3$ $O_7$-L modified with a self-assembled monolayer of *N*-(3-aminopropyl)pyrrole: hardwiring the "electroactive hot spots" on a superconductor electrode, *J. Am. Chem. Soc.*, 118:11295-6 (1996).
Loo et al., Interfacial chemistries for nanoscale transfer printing, *J. Am. Chem. Soc.*, 124:7654-5 (2002).
Lunt et al., Chemical studies of the passivation of GaAs surface recombination using sulfides and thiols, *J. Appl. Phys.*, 70:7449-67 (1991).
Lunt et al., Passivation of GaAs surface recombination with organic thiols, *J. Vacuum Sci. Technol. B*, 9:2333-6 (1991).
Maoz et al., Nanoelectrochemical patterning of monolayer surfaces: toward spatially defined self-assembly of nanostructures, *Adv. Mater.*, 11:55-61 (1999).
Maoz et al., Penetration-controlled reactions in organized monolayer assemblies. 1. Aqueous permanganate interaction with monolayer and multilayer films of long-chain surfactants, *Langmuir*, 3:1034-44 (1987).
Maoz et al., Penetration-controlled reactions in organized monolayers assemblies. 2. Aqueous permanganate interaction with self-assembling monolayers of long-chain surfactants, *Langmuir*, 3:1045-51 (1987).
Martin et al., Direct protein microarray fabrication using a hydrogel "stamper", *Langmuir*, 14:3791-5 (1998).
Matteucci et al., Synthesis of deoxyoligonucleotides on a polymer support, *J Am Chem Soc*, 103:3185-91 (1981).
Mayya et al., A study of the partitioning of colloidal particles based on their size during electrostatic immobilization at the air-water interface using fatty amine monolayers, *J. Phys. Chem. B*, 101, 9790-3 (1997).
Menzel et al., Surface-confined nanoparticles as substrates for photopolymerizable self-assembled monolayers, *Adv. Mater.*, 11:131-4 (1999).
Meyer et al., Evidence for adduct formation at the semiconductor-gas interface. Photoluminescent properties of cadmium selenide in the presence of amines, *J. Am. Chem. Soc.*, 110: 4914-18 (1988).
Mirkin et al., Controlling the surface properties of high temperature superconductors, *Adv. Mater.*, 9:167-73 (1997).
Mirkin, The power of the pen: development of massively parallel dip-pen nanolithography, *ACS Nano*, 1:79-83 (2007).
Mucic et al., Synthesis and characterization of DNA with ferrocenyl groups attached to their 5-termini: electrochemical characterization of a redox-active nucleotide monolayer, *Chem Commun*, 555-557 (1996).
Nakagawa et al., GaAs interfaces with octadecyl thiol self-assembled monolayer: structural and electrical properties, *Japan J. Appl. Phys. Part I*, 30:3759-62 (1991).
Nuzzo et al., Spontaneously organized molecular assemblies. 3. Preparation and properties of solution adsorbed monolayers of organic disulfides on gold surfaces, *J Am Chem Soc*, 109:2358-2368 (1987).
Odom et al., Improved pattern transfer in soft lithography using composite stamps, *Langmuir*, 18:5314-20 (2002).
Patil et al., Surface derivatization of colloidal silver particles using interdigitized bilayers: a novel strategy for electrostatic immobilization of colloidal particles in thermally evaporated fatty acid/fatty amine films, *Langmuir*, 14, 2707-11 (1998).
Pereira et al., Modification of surface properties of alumina by plasma treatment, *J. Mater. Chem.*, 10, 259-61 (2000).
Piner et al., 'Dip-Pen' nanolithography, *Science*, 283:661-3 (1999).
Porter et al., Gold and silver nanoparticles functionalized by the adsorption of dialkyl disulfides, *Langmuir*, 14, 7378-86 (1998).
Qi et al., A three-dimensional optical photonic crystal with designed point defects, *Nature*, 429:538-42 (2004).
Salaita et al., Applications of dip-pen nanolithography, *Nat. Nanotechnol.*, 2:145-55 (2007).

(56) References Cited

OTHER PUBLICATIONS

Salaita et al., Massively parallel dip-pen nanolithography with 55 000-pen two-dimensional arrays, *Angew Chem Int Ed Engl.*, 45:7220-3 (2006).

Sastry et al., Langmuir-blodgett films of carboxylic acid derivatized silver colloidal particles: role of subphase pH on degree of cluster incorporation, *J. Phys. Chem. B*, 101:4954-8 (1997).

Schmid et al., Siloxane Polymers for High-Resolution, High-Accuracy Soft Lithography, *Macromolecules*, 33:3042-9 (2000).

Sheen et al., A new class of organized self-assembled monolayers: Alkane thiols on GaAs (100), *J. Am. Chem. Soc.*, 114:1514-5 (1992).

Slavov et al., Mechanism of silation of silica with hexamethyldisilazane, *J. Phys. Chem. B*, 104:983-9 (2000).

Son et al., Adsorption of 4-methoxybenzyl cyanide on silver and gold surfaces investigated by fourier transform infrared spectroscopy, *J. Phys. Chem.*, 98:8488-93 (1994).

Soriaga et al., Determination of the orientation of aromatic molecules adsorbed on platinum electrodes. The effect of solute concentration, *J Am Chem Soc*, 104:3937-45 (1982).

Steiner et al., Adsorption of alkanenitriles and alkanedinitriles on gold and copper, *Langmuir*, 8, 2771-7 (1992).

Steiner et al., Adsorption of $NPh_3$, $PPh_3$, $AsPh_3$, $SbPh_3$, and $BiPh_3$ on gold and copper, *Langmuir*, 8, 90-4 (1992).

Tao, Structural comparison of self-assembled monolayers of n-alkanoic acids on the surfaces of silver, copper, and aluminum, *J. Am. Chem. Soc.*, 115:4350-8 (1993).

Timmons et al., Investigation of fatty acid monolayers on metals by contact potential measurements, *J Phys Chem*, 69:984-990 (1965).

Ulman, An Introduction to Ultrathin Organic Films: From Langmuir-Blodgett to Self-Assembly, Boston: Academic Press (1991).

Ulman, Formation and Structure of Self-Assembled Monolayers, *Chem. Rev.*, 96:1533-54 (1996).

Walczak et al., Structure and interfacial properties of spontaneously adsorbed n-alkanethiolate monolayers on evaporated silver surfaces, *J. Am. Chem. Soc.*, 113:2370-8 (1991).

Wang et al., Scanning probe contact printing, *Langmuir*, 19:8951-5 (2003).

Wasserman et al., Structure and reactivity of alkylsiloxane monolayers formed by reaction of alkyltrichlorosilanes on silicon substrates, *Langmuir*, 5:1074-1087 (1989).

Whitesides, Proceedings of the Robert A. Welch Foundation 39th Conference on Chemical Research Nanophase Chemistry, Houston, Texas, pp. 109-121 (1995).

Xia et al., Soft lithography, *Ann. Rev. Mater. Sci.*, 28:153 (1998).

Xia et al., Soft lithography, *Angew. Chem. Int. Ed.*, 37:550-75 (1998).

Xu et al., Surface coordination chemistry of $YBa_2 Cu_3 O_7$-$\delta$, *Langmuir*, 14:6505-11 (1998).

Yonezawa et al., Layered nanocomposite of close-packed gold nanoparticles and $TiO2$ gel layers, *Chem. Mater.*, 11:33-5 (1999).

Yousaf et al., Using electroactive substrates to pattern the attachment of two different cell populations, *Proc. Natl. Acad. Sci. USA*, 98:5992-6 (2001).

Zhang et al., Dip pen nanolithography stamp tip, *Nano Lett.*, 4:1649-55 (2004).

Zheng et al., Topography printing to locally control wettability, *J. Am. Chem. Soc.*, 128:7730-1 (2006).

\* cited by examiner

POLYMER PEN LITHOGRAPHY

CROSS-REFERENCE TO RELATED APPLICATIONS

The benefit under 35 USC §119(e) of U.S. Provisional Application Ser. No. 61/047,910, filed Apr. 25, 2008, U.S. Provisional Application Ser. No. 61/049,679, filed May 1, 2008, and U.S. Provisional Application Ser. No. 61/076,199, filed Jun. 27, 2008, is hereby claimed, and their entire disclosures are incorporated herein by reference.

STATEMENT OF GOVERNMENTAL INTEREST

This invention was made with government support under Grant Number 5 U54 CA 119341-3 awarded by the National Institutes of Health (National Cancer Institute); and Grant Number EEC-0647560 awarded by the National Science Foundation (NSEC). The government has certain rights in the invention.

BACKGROUND

Lithography is used in many areas of modern science and technology, including the production of integrated circuits, information storage devices, video screens, micro-electromechanical systems (MEMS), miniaturized sensors, microfluidic devices, biochips, photonic bandgap structures, and diffractive optical elements (1-6). Generally, lithography can be divided into two categories based on patterning strategy: parallel replication and serial writing. Parallel replication methods such as photolithography (7), contact printing (8-11), and nanoimprint lithography (12) are useful for high throughput, large area patterning. However, most of these methods can only duplicate patterns, which are predefined by serial writing approaches and thus cannot be used to arbitrarily generate different patterns (i.e. one mask leads to one set of structures). In contrast, serial writing methods, including electron-beam lithography (EBL), ion beam lithography, and many scanning probe microscopy (SPM)-based methods (13-16), can create patterns with high resolution and registration, but are limited in throughput (17, 18). Indeed, only recently have researchers determined ways to use two-dimensional cantilever arrays for Dip-Pen Nanolithography (DPN) to produce patterned structures made of molecule-based materials over square centimeter areas (19, 20).

DPN uses an "ink"-coated atomic force microscope (AFM) cantilever to deliver soft or hard materials to a surface with high registration and sub-50-nm resolution in a "constructive" manner (3, 16, 21-23). When combined with high density cantilever arrays, DPN is a versatile and powerful tool for constructing molecule-based patterns over relatively large areas with moderate throughput (1). The limitations of DPN are: 1) the inability to easily and rapidly work across the micro and nanometer length scales in a single experiment (typically, either sharp tips are optimized to generate nanoscale features or blunt tips are used to generate microscale features) (24); and 2) the need for fragile and costly two-dimensional cantilever arrays to achieve large area patterning. Indeed, no simple strategy exists that allows one to rapidly pattern molecule-based features with sizes ranging from the nanometer to millimeter scale in a parallel, high throughput, and direct-write manner. Thus, a need exists for lithography methods that can yield a high resolution, registration and throughput, soft-matter compatible, and low cost patterning capability.

SUMMARY

The present disclosure is directed to methods of printing indicia on a substrate surface using a polymer tip array. More specifically, disclosed herein are methods of printing indicia on a substrate surface using a tip array comprising a compressible polymer comprising a plurality of non-cantilevered tips each having a radius of curvature of less than about 1 µm.

Thus, in one aspect, provided herein is a method of printing indicia on a substrate surface comprising (1) coating a tip array with a patterning composition, the tip array comprising a compressible elastomeric polymer having a plurality of tips each having a radius of curvature of less than about 1 µm, (2) contacting the substrate surface for a first contacting period of time and first contacting pressure with all or substantially all of the coated tips of the array and thereby depositing the patterning composition onto the substrate surface to form indicia having a substantially uniform feature size of less than 1 µm, and preferably also a substantially uniform feature shape. The coating can comprise adsorbing or absorbing the patterning composition onto the tip array. The method can further comprise moving only one of the tip array or the substrate surface, or moving both the tip array and the substrate surface and repeating the contacting step for a second contacting period of time and second contacting pressure. The first and second contacting periods of time and pressures can be the same or different. The contacting pressure can be controlled by controlling the z-piezo of a piezo scanner upon which the substrate or tip array is mounted. The lateral movement between the tip array and the substrate surface can be controlled (e.g., by varying movement and/or limiting movement) to form indicia comprising dots, lines (e.g., straight or curved, formed from individual dots or continuously), a preselected pattern, or any combination thereof. Controlling the contacting pressure and/or contacting period of time can produce indicia, e.g. dots, having a controllable, reproducible size. The indicia formed by the methods disclosed can have a minimum feature size (e.g., dot size or line width) less than a micron, for example 900 nm or less, 800 nm or less, 700 nm or less, 600 nm or less, 500 nm or less, 400 nm or less, 300 nm or less, 200 nm or less, 100 nm or less, 100 nm or less, or 80 nm or less.

Another aspect of the disclosure provides methods of leveling a tip array disclosed herein with respect to a substrate surface.

One method includes backlighting the tip array with incident light to cause internal reflection of the incident light from the internal surfaces of the tips, bringing the tips of the tip array and the substrate surface together along a z-axis up to a point of contact between a subset of the tips with the substrate surface, contact indicated by increased intensity of reflected light from the subset of tips in contact with the substrate surface, whereas no change in the intensity of reflected light from other tips indicates non-contacting tips, and tilting one or both of the tip array and the substrate surface with respect to the other in response to differences in intensity of the reflected light from the internal surfaces of the tips, to achieve contact between the substrate surface and non-contacting tips. The tilting can be performed one or more times and along any one of the x-, y-, and z-axes, to level the array of tips with respect to the substrate surface. The reflected light can be observed by transmission of at least a portion of the reflected light back through the tip array material in the direction of the incident light, if the tip array material is at least translucent. Preferably any substrate to which the tip array is mounted will also be at least translucent or transparent.

Another method includes backlighting the tip array with incident light to cause internal reflection of the incident light from the internal surfaces of the tips, bringing the tips of the tip array and the substrate surface together along a z-axis to cause contact between the tips of the tip array and the substrate surface, further moving one or both of the tip array and the substrate towards the other along the z-axis to compress a subset of the tips, whereby the intensity of the reflected light from the tips increases as a function of the degree of compression of the tips against the substrate surface, and tilting one or both of the tip array and the substrate surface with respect to the other in response to differences in intensity of the reflected light from internal surfaces of the tips, to achieve substantially uniform contact between the substrate surface and tips. The tilting can be performed one or more times and along any one of the x-, y-, and z-axes, to level the array of tips with respect to the substrate surface, e.g. as determined by uniform intensity of reflected light from the tips. The reflected light can be observed by transmission of at least a portion of the reflected light back through the tip array material in the direction of the incident light, if the tip array material is at least translucent. Preferably any substrate to which the tip array is mounted will also be at least translucent or transparent.

Another aspect of the present disclosure provides a tip array. The tip array can comprise a plurality of tips arranged in a regular periodic pattern. The radius of curvature of the tips can be less than about 0.5 µm, less than about 0.2 µm, or less than about 100 nm. The tips can be identically shaped, and can be pyramidal. The polymer of the tip array can have a compression modulus of about 10 MPa to about 300 MPa. The polymer can be Hookean under pressures of about 10 MPa to about 300 MPa. The polymer can be crosslinked. The polymer can comprise polydimethylsiloxane (PDMS). The PDMS can be trimethylsiloxy terminated vinylmethylsiloxane-dimethylsiloxane copolymer, a methylhydrosiloxane-dimethylsiloxane copolymer, or a mixture thereof. The tip array can be fixed to a common substrate. The common substrate can comprise a rigid support, such as glass. Alternatively, the common substrate can be adhered to a rigid support. The common substrate can comprise an elastomeric layer which can comprise the same polymer as that of the tip array, or can be a different elastomeric polymer from the tip array. The tip array, common substrate, and/or rigid support can be at least translucent, and can be transparent. In a specific embodiment, the tip array, common substrate, and rigid support, when present, are each at least translucent or transparent. The tip array and common substrate (e.g., elastomeric layer) can have a height of less than about 200 µm, preferably less than about 150 µm, or more preferably about 100 µm.

Yet another aspect of the present disclosure provides a method of making a tip array, as disclosed herein. The method comprises forming a master comprising an array of recesses in a substrate separated by lands; filling the recesses and covering the lands with a prepolymer mixture comprising a prepolymer and optionally a crosslinker; curing the prepolymer mixture to form a polymer structure; and separating the polymer structure from the master. The method can further comprise forming the recesses as pyramidal recesses by forming the wells in the substrate and aniostropically wet-etching the substrate. The method can further comprise covering the filled and coated substrate with a planar glass layer prior to curing.

DETAILED DESCRIPTION

Figure 1:
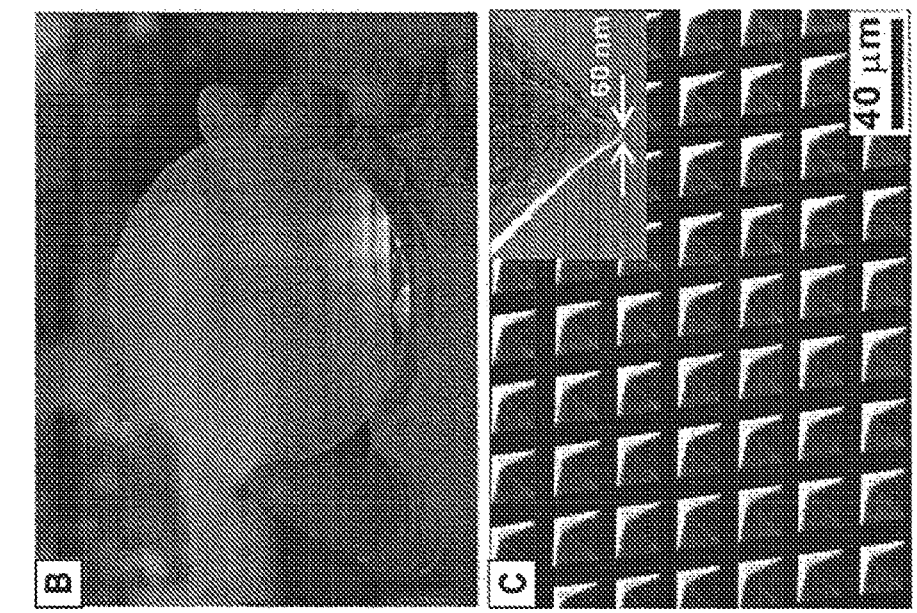
FIG. 1. (A) A schematic illustration of the Polymer Pen Lithography setup. (B) A photograph of a 11 million pen array. (C) SEM image of the polymer pen array. The average tip radius of curvature is 70±10 nm (inset).
Figure 1:
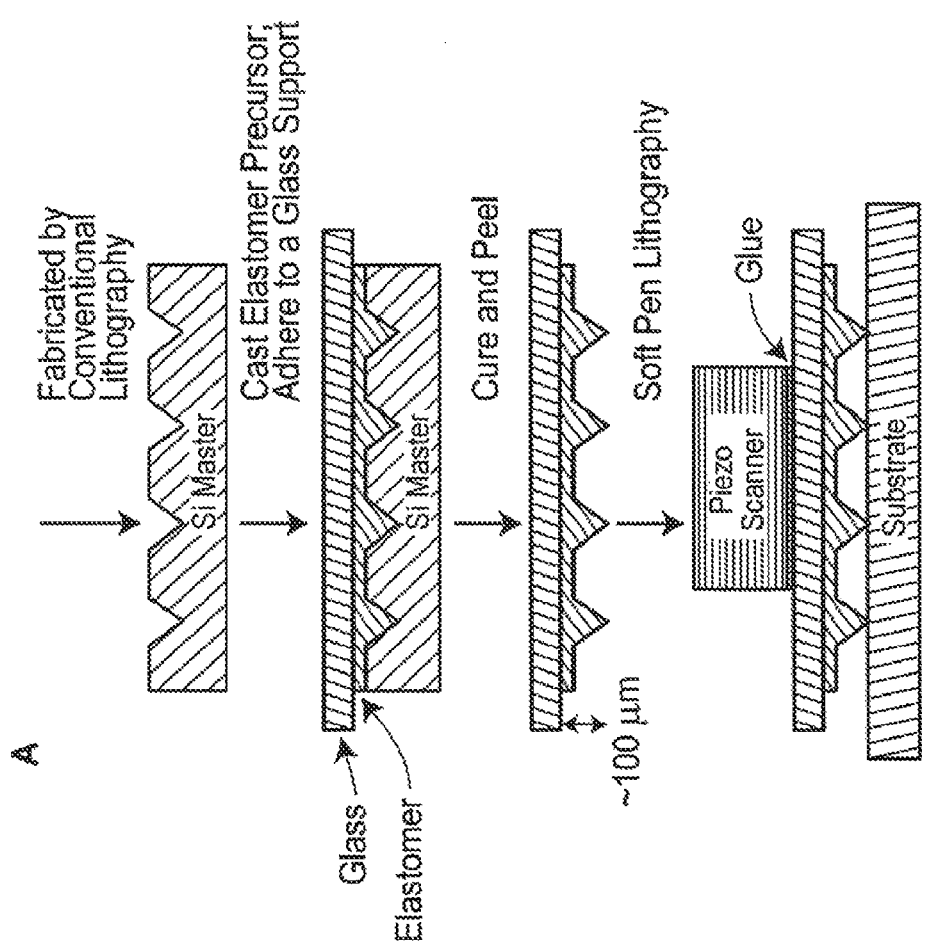
Figure 4:
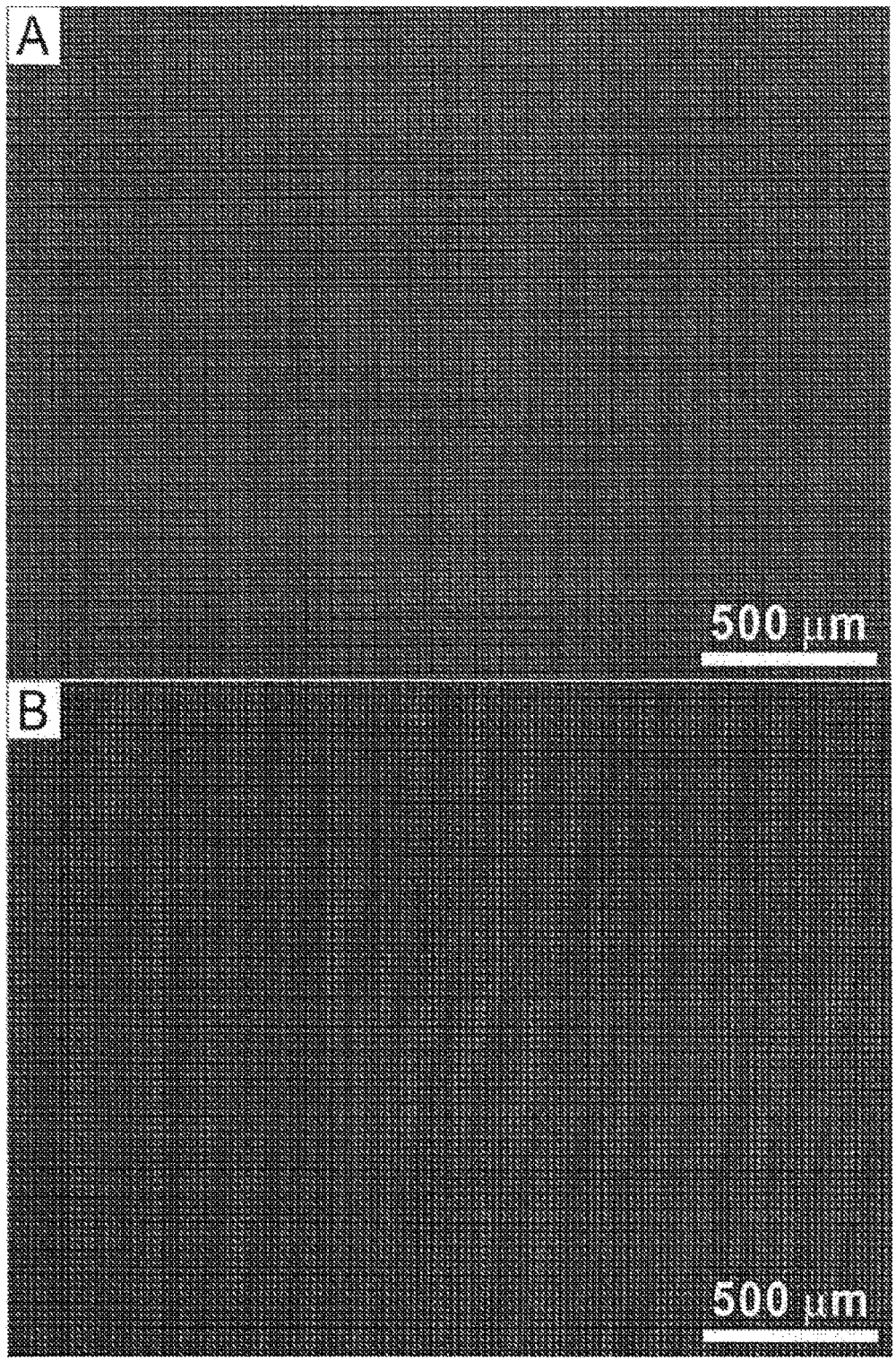
FIG. 4. SEM images of a polymer pen array (A) with and (B) without a glass support. The polymer pen array with a glass support is uniform across the whole area, while the one without a glass support is wavy.

Polymer Pen Lithography is a direct-write method that delivers collections of molecules in a positive printing mode. In contrast with DPN and other SPM-based lithographies, which typically use hard silicon-based cantilevers, Polymer Pen Lithography utilizes elastomeric tips without cantilevers (25, 26) as the ink delivery tool. The tips are preferably made of polydimethylsiloxane, PDMS. A preferred polymer pen array (FIG. 1) contains thousands of tips, preferably having a pyramidal shape, which can be made with a master prepared by conventional photolithography and subsequent wet chemical etching (FIG. 1A). The tips preferably are connected by a common substrate which includes a thin polymer backing layer (50-100 µm thick), which preferably is adhered to a rigid support (e.g., a glass, silicon, quartz, ceramic, polymer, or any combination thereof), e.g. prior to or via curing of the polymer. The rigid support is preferably highly rigid and has a highly planar surface upon which to mount the array (e.g., silica glass, quartz, and the like). The rigid support and thin backing layer significantly improve the uniformity of the polymer pen array over large areas, such as three inch wafer surface (FIG. 1B, 4), and make possible the leveling and uniform, controlled use of the array. When the sharp tips of the polymer pens are brought in contact with a substrate, ink is delivered at the points of contact (FIG. 1A).

The amount of light reflected from the internal surfaces of the tips increases significantly when the tips make contact with the substrate. Therefore, a translucent or transparent elastomer polymer pen array allows one to visually determine when all of the tips are in contact with an underlying substrate, permitting one to address the otherwise daunting task of leveling the array in an experimentally straightforward manner. Thus, preferably one or more of the array tips, backing layer, and rigid support are at least translucent, and preferably transparent.

Figure 5:
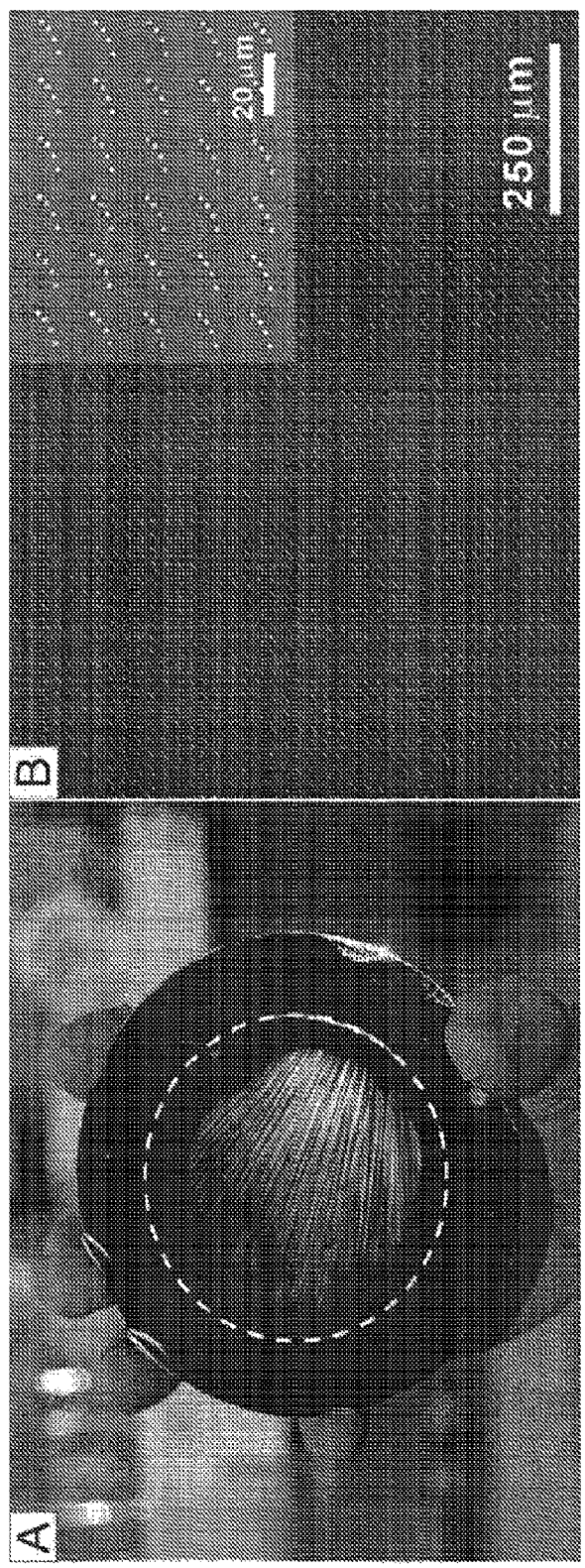
FIG. 5. (A) A photograph of an etched gold pattern on a 4 inch Si wafer fabricated by Polymer Pen Lithography using the 11-million pen array shown in FIG. 1B. The area patterned by the pen array is highlighted with a white dashed line. In the center of the pen array, greater than 99% of the pens uniformly deliver the MHA ink to the substrate during the Polymer Pen Lithography process and form well-defined structures. Reduced activity occurs on the periphery of the array, due to poor contact between the pens in the peripheral area of the array and the Si substrate. This arises from current instrument sample holder limitations. (B) Optical microscope image of gold patterns in (A) made by Polymer Pen Lithography. The inset is a zoom-in image. The image shows that every intended structure forms in this experiment.

Polymer Pen Lithography experiments were performed with an Nscriptor™ system (NanoInk Inc., IL) equipped with a 90-μm closed loop scanner and commercial lithography software (DPNWrite™, DPN System-2, NanoInk Inc., IL). Depending upon intended use, the pitch of a pen array is deliberately set between 20 μm and 1 mm, corresponding to pen densities of 250,000/cm$^2$ and 100/cm$^2$, respectively. Larger pitch arrays are required to make large features (micron or millimeter scale) but also can be used to make nanometer scale features. All of the pens were remarkably uniform in size and shape, with an average tip radius of 70±10 nm (FIG. 1C). In principle, this value could be reduced substantially with higher quality masters and stiffer elastomers. For the examples below, the tip array used contained either 15,000 or 28,000 pyramid-shaped pens, but arrays with as many as about 11,000,000 pens have also been used to pattern structures (FIG. 5).

Figure 2:
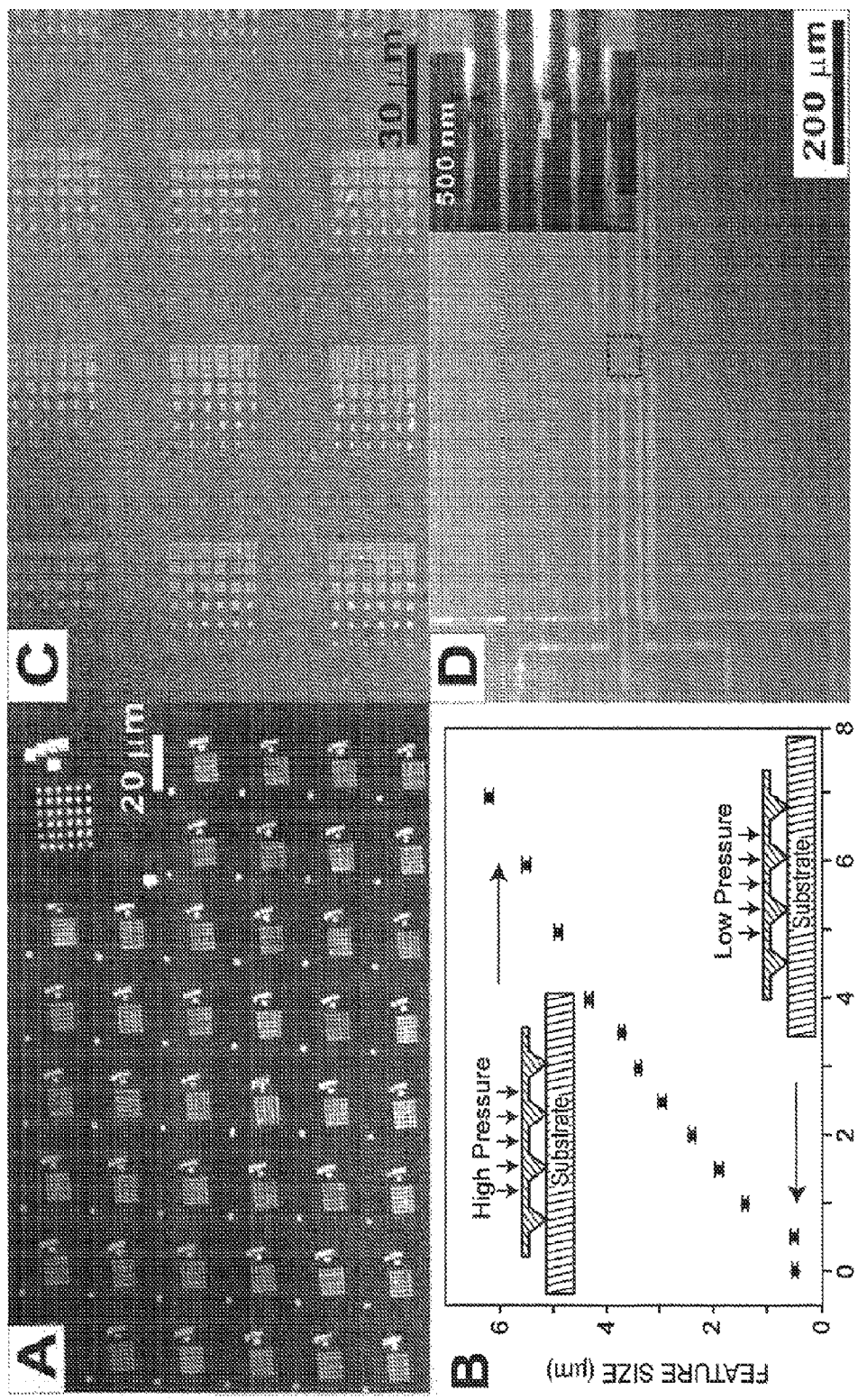
FIG. 2. (A) Optical image of a 480 µm×360 µm section of a one million gold dot array (6×6 within each block) on a silicon substrate (using a pen array with 28,000 pyramid-shaped tips). (B) MHA dot size as a function of relative z-piezo extension. The results were obtained using a polymer pen array with 15,000 pyramid-shaped tips at 25° C. with a relative humidity of 40%. (C) Optical image of arrays of gold squares generated at different z-piezo extensions (using a pen array with 28,000 pyramid-shaped tips). (D) An optical microscope image of a multi-dimensional gold circuit fabricated by Polymer Pen Lithography. The inset shows a magnified image of the circuit center.

In a typical experiment, a pen array (1 cm$^2$ in size) was inked by immersing it in a saturated solution of 16-mercaptohexadecanoic acid (MHA) in ethanol for five minutes followed by rinsing with ethanol. The inked pen array was used for generating 1-μm diameter MHA dot patterns on a thermally evaporated polycrystalline gold substrate (25 nm Au with a 5 nm Ti adhesion layer coated on Si) by bringing it in contact with the gold surface for 0.1 s. This process of contacting the gold substrate was repeated 35 times to generate a 6×6 array of MHA dots (less than 10% deviation in feature diameter). The exposed gold on this MHA patterned substrate was subsequently etched (20 mM thiourea, 30 mM iron nitrate, 20 mM hydrochloric acid, and 2 mM octanol in water) to yield raised structures that are approximately 25 nm in height and easily imaged by optical microscopy (FIG. 2A).

Figure 6:
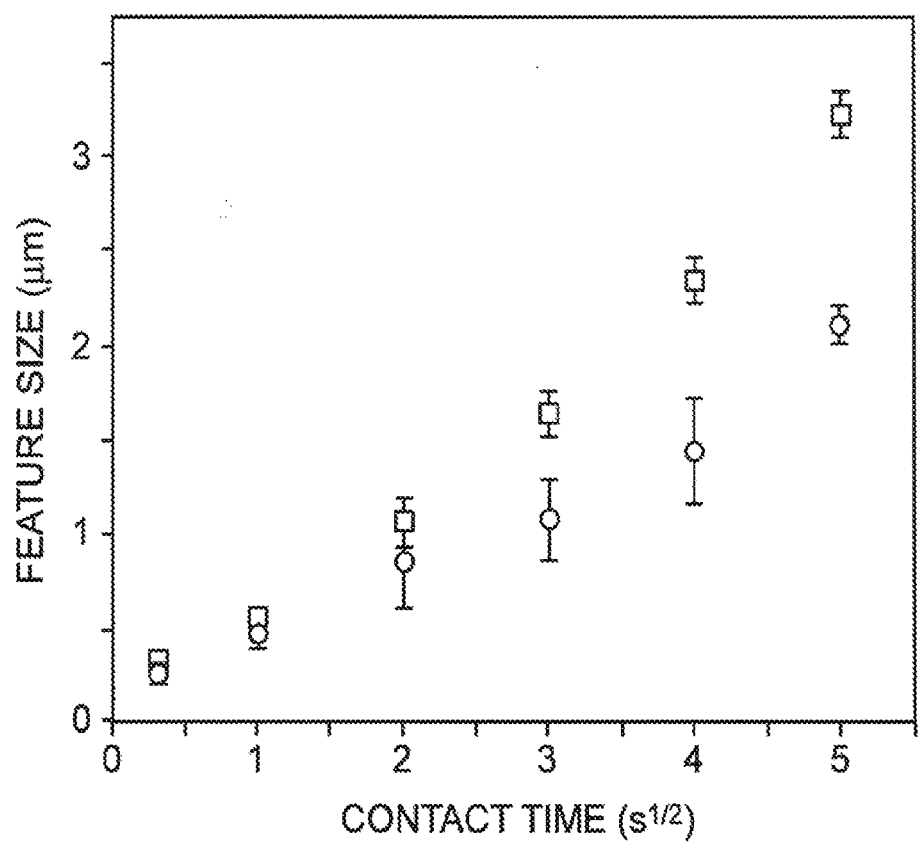
FIG. 6. MHA dot size as a function of tip-substrate contact time. Dot size increases with increasing tip-substrate contact time at constant contact (pressure) (initial contact). The results were obtained using a polymer pen array with 15,000 pyramid-shaped tips at a temperature of 23° C. and relative humidity of 50% (circles) and 90% (squares).

A defining characteristic of Polymer Pen Lithography, in contrast with DPN and most contact printing strategies which are typically viewed as pressure or force-independent (21), is that it exhibits both time- and pressure-dependent ink transport. As with DPN, features made by Polymer Pen Lithography exhibit a size that is linearly dependent on the square root of the tip-substrate contact time (FIG. 6) (27, 28). This property of Polymer Pen Lithography, which is a result of the diffusive characteristics of the ink and the small size of the delivery tips, allows one to pattern sub-micron features with high precision and reproducibility (variation of feature size is less than 10% under the same experimental conditions). The pressure dependence of Polymer Pen Lithography derives from the compressible nature of the elastomer pyramid array. Indeed, the microscopic, preferably pyramidal, tips can be made to deform with successively increasing amounts of applied pressure, which can be controlled by simply extending the piezo in the vertical direction (z-piezo). Although such deformation has been regarded as a major drawback in contact printing (it can result in "roof" collapse and limit feature size resolution), with Polymer Pen Lithography, the controlled deformation can be used as an adjustable variable, allowing one to control tip-substrate contact area and resulting feature size. Within the pressure range allowed by z-piezo extension of about 5 to about 25 μm, one can observe a near linear relationship between piezo extension and feature size at a fixed contact time of 1 s (FIG. 2B). Interestingly, at the point of initial contact and up to a relative extension 0.5 μm, the sizes of the MHA dots do not significantly differ and are both about 500 nm, indicating that the backing elastomer layer, which connects all of the pyramids, deforms before the pyramid-shaped tips do. This type of buffering is fortuitous and essential for leveling because it provides extra tolerance in bringing all of the tips in contact with the surface without tip deformation and significantly changing the intended feature size. When the z-piezo extends 1 μm or more, the tips exhibit a significant and controllable deformation (FIG. 2B).

With the pressure dependency of Polymer Pen Lithography, one does not have to rely on the time-consuming, meniscus-mediated ink diffusion process to generate large features. Indeed, one can generate either nanometer or micrometer sized features in only one printing cycle by simply adjusting the degree of tip deformation. As proof-of-concept, 6×6 gold square arrays, where each square in a row was written with one printing cycle at different tip-substrate pressures but a constant 1 s tip-substrate contact time, were fabricated by Polymer Pen Lithography and subsequent wet chemical etching (FIG. 2C). The largest and smallest gold squares are 4 μm and 600 nm on edge, respectively. Note that this experiment does not define the feature size range attainable in a Polymer Pen Lithography experiment, but rather, is a demonstration of the multiple scales accessible by Polymer Pen Lithography at a fixed tip-substrate contact time (1 s in this case).

Polymer Pen Lithography, unlike conventional contact printing, allows for the combinatorial patterning of molecule-based and solid-state features with dynamic control over feature size, spacing, and shape. This is accomplished by using the polymer tips to form a dot pattern of the structure one wants to make. As proof-of-concept, a polymer pen array with 100 pyramidal tips spaced 1 mm apart was used to generate 100 duplicates of an integrated gold circuit. The width of each electrode in the center of the circuit is 500 nm, while the width of each electrode lead going to these nanometer scale electrodes is 10 μm, and the size of the external bonding pad is a 100×100 μm$^2$ (FIG. 2D). Since the Nscriptor™ only provides a 90×90 μm$^2$ scanner, the circuits were divided into 35 80×80 μm$^2$ sub-patterns, which were stitched together by manually moving the stage motor after each sub-pattern was generated. This limitation could be addressed by programming the movement of the stage motor relative to the positions of the multiple sub-patterns. To accommodate both the resolution and throughput concerns, different relative z-piezo extensions at different positions of the circuit were used, where 0 (initial contact), 2, and 6 μm were used for the central electrodes, electrode leads, and bonding pads, respectively. As a result, writing a 100×100 μm$^2$ area only requires 400 printing cycles (less than 0.5 s for each cycle), and the total time required to generate 100 duplicates of the circuit took approximately 2 hr. Re-inking of the pen array is not necessary because the PDMS polymer behaves as a reservoir for the ink throughout the experiment (27, 28). This relatively high-throughput production of multiscale patterns would be difficult, if not impossible, to do by EBL or DPN.

Figure 3:
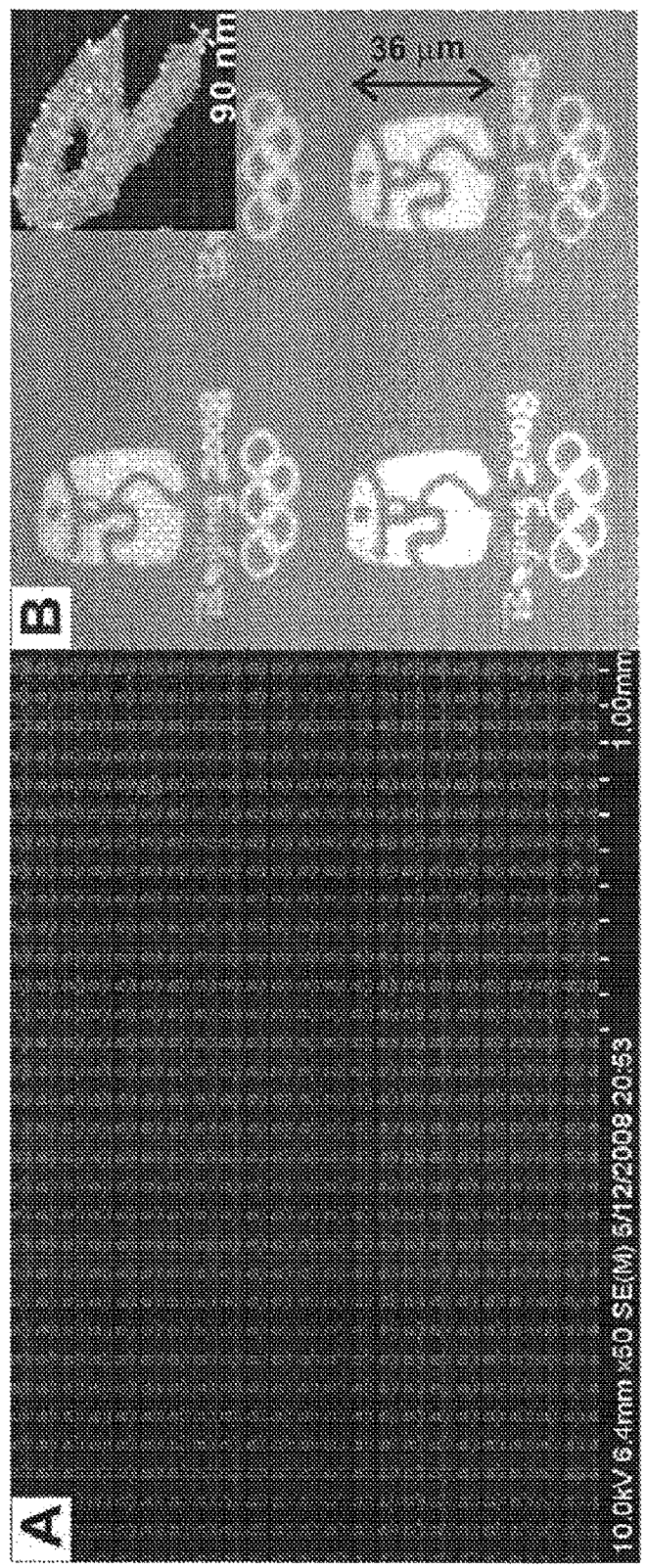
FIG. 3. (A) SEM image of a representative region of approximately 15,000 miniaturized duplicates of the 2008 Beijing Olympic logo. (B) A zoom-in optical image of a representative replica. The inset shows a magnified SEM image of the letter "e".

Note that the maskless nature of Polymer Pen Lithography allows one to arbitrarily make many types of structures without the hurdle of designing a new master via a throughput-impeded serial process. In addition, Polymer Pen Lithography can be used with sub-100 nm resolution with the registration capabilities of a closed-loop scanner. For example, Polymer Pen Lithography was used to generate 15,000 replicas of the 2008 Beijing Olympic logo on gold with MHA as the ink and subsequent wet chemical etching (FIG. 3A). Each logo was generated using the multiscale capabilities of Polymer Pen Lithography from a 70×60 µm² bitmap. The letters and numbers, "Beijing 2008", were generated from ~20,000 90-nm dots (initial contact), while the picture and Olympic rings were made from ~4,000 600-nm dots at higher array-substrate contact pressures (relative piezo extension=1 µm). These structures were created by holding the pen array at each spot for 0.05 s and traveling between spots at a speed of 60 µm/s. A representative portion of the approximately 15,000 replicas (yield>99%) generated across the 1 cm² substrate shows their uniformity (FIG. 3B). The total time required to fabricate all of these structures was less than 40 min.

A new lithography method, termed Polymer Pen Lithography, has been developed using elastomeric pen arrays mounted on an inscripting device, such as an Nscriptor™ instrument, to generate nano- and microscale features in a constructive manner. The technique merges many of the attributes of DPN and contact printing to yield patterning capabilities that span multiple length scales with high throughput and low cost. The novel time- and pressure-dependent ink transport properties of the polymer pen pyramid arrays provide important and tunable variables that distinguish Polymer Pen Lithography from the many nano- and microfabrication approaches that have been developed to date. Since Polymer Pen Lithography is a direct-write technique, it is also useful for fabricating arrays of structures made of soft matter, such as proteins (FIG. 7), making it useful in the life sciences as well.

Tip Arrays

The lithography methods disclosed herein employ a tip array formed from elastomeric polymer material. The tip arrays are non-cantilevered and comprise tips which can be designed to have any shape or spacing between them, as needed. The shape of each tip can be the same or different from other tips of the array. Contemplated tip shapes include spheroid, hemispheroid, toroid, polyhedron, cone, cylinder, and pyramid (trigonal or square). The tips are sharp, so that they are suitable for forming submicron patterns, e.g., less than about 500 nm. The sharpness of the tip is measured by its radius of curvature, and the radius of curvature of the tips disclosed herein is below 1 µm, and can be less than about 0.9 µm, less than about 0.8 µm, less than about 0.7 µm, less than about 0.6 µm, less than about 0.5 µm, less than about 0.4 µm, less than about 0.3 µm, less than about 0.2 µm, less than about 0.1 µm, less than about 90 nm, less than about 80 nm, less than about 70 nm, less than about 60 nm, or less than about 50 nm.

The tip array can be formed from a mold made using photolithography methods, which is then used to fashion the tip array using a polymer as disclosed herein. The mold can be engineered to contain as many tips arrayed in any fashion desired. The tips of the tip array can be any number desired, and contemplated numbers of tips include about 1000 tips to about 15 million tips, or greater. The number of tips of the tip array can be greater than about 1 million, greater than about 2 million, greater than about 3 million, greater than about 4 million, greater than 5 million tips, greater than 6 million, greater than 7 million, greater than 8 million, greater than 9 million, greater than 10 million, greater than 11 million, greater than 12 million, greater than 13 million, greater than 14 million, or greater than 15 million tips.

The tips of the tip array can be designed to have any desired thickness, but typically the thickness of the tip array is about 50 nm to about 1 µm, about 50 nm to about 500 nm, about 50 nm to about 400 nm, about 50 nm to about 300 nm, about 50 nm to about 200 nm, or about 50 nm to about 100 nm.

The polymers can be any polymer having a compressibility compatible with the lithographic methods. Polymeric materials suitable for use in the tip array can have linear or branched backbones, and can be crosslinked or non-crosslinked, depending upon the particular polymer and the degree of compressibility desired for the tip. Cross-linkers refer to multi-functional monomers capable of forming two or more covalent bonds between polymer molecules. Non-limiting examples of cross-linkers include such as trimethylolpropane trimethacrylate (TMPTMA), divinylbenzene, di-epoxies, tri-epoxies, tetra-epoxies, di-vinyl ethers, tri-vinyl ethers, tetra-vinyl ethers, and combinations thereof.

Thermoplastic or thermosetting polymers can be used, as can crosslinked elastomers. In general, the polymers can be porous and/or amorphous. A variety of elastomeric polymeric materials are contemplated, including polymers of the general classes of silicone polymers and epoxy polymers. Polymers having low glass transition temperatures such as, for example, below 25° C. or more preferably below −50° C., can be used. Diglycidyl ethers of bisphenol A can be used, in addition to compounds based on aromatic amine, triazine, and cycloaliphatic backbones. Another example includes Novolac polymers. Other contemplated elastomeric polymers include methylchlorosilanes, ethylchlorosilanes, and phenylchlorosilanes, polydimethylsiloxane (PDMS). Other materials include polyethylene, polystyrene, polybutadiene, polyurethane, polyisoprene, polyacrylic rubber, fluorosilicone rubber, and fluoroelastomers.

Further examples of suitable polymers that may be used to form a tip can be found in U.S. Pat. No. 5,776,748; U.S. Pat. No. 6,596,346; and U.S. Pat. No. 6,500,549, each of which is hereby incorporated by reference in its entirety. Other suitable polymers include those disclosed by He et al., *Langmuir* 2003, 19, 6982-6986; Donzel et al., *Adv. Mater.* 2001, 13, 1164-1167; and Martin et al., *Langmuir*, 1998, 14-15, 3791-3795. Hydrophobic polymers such as polydimethylsiloxane can be modified either chemically or physically by, for example, exposure to a solution of a strong oxidizer or to an oxygen plasma.

The polymer of the tip array has a suitable compression modulus and surface hardness to prevent collapse of the polymer during inking and printing, but too high a modulus and too great a surface hardness can lead to a brittle material that cannot adapt and conform to a substrate surface during printing. As disclosed in Schmid, et al., *Macromolecules*, 33:3042 (2000), vinyl and hydrosilane prepolymers can be tailored to provide polymers of different modulus and surface hardness. Thus, in some cases, the polymer is a mixture of vinyl and hydrosilane prepolymers, where the weight ratio of vinyl prepolymer to hydrosilane crosslinker is about 5:1 to about 20:1, about 7:1 to about 15:1, or about 8:1 to about 12:1.

The polymers of the tip array preferably will have a surface hardness of about 0.2% to about 3.5% of glass, as measured by resistance of a surface to penetration by a hard sphere with a diameter of 1 mm, compared to the resistance of a glass surface (as described in Schmid, et al., *Macromolecules*, 33:3042 (2000) at p 3044). The surface hardness can be about 0.3% to about 3.3%, about 0.4% to about 3.2%, about 0.5% to about 3.0%, or about 0.7% to about 2.7%. The polymers of the tip array can have a compression modulus of about 10 MPa to about 300 MPa. The tip array preferably comprises a compressible polymer which is Hookean under pressures of about 10 MPa to about 300 MPa. The linear relationship between pressure exerted on the tip array and the feature size allows for control of the indicia printed using the disclosed methods and tip arrays (see FIG. 2B).

The tip array can comprise a polymer that has adsorption and/or absorption properties for the patterning composition, such that the tip array acts as its own patterning composition reservoir. For example, PDMS is known to adsorb patterning inks, see, e.g., US Patent Publication No. 2004/228962, Zhang, et al., *Nano Lett.* 4, 1649 (2004), and Wang et al., *Langmuir* 19, 8951 (2003).

The tip array can comprise a plurality of tips fixed to a common substrate and formed from a polymer as disclosed herein. The tips can be arranged randomly or in a regular periodic pattern (e.g., in columns and rows, in a circular pattern, or the like). The tips can all have the same shape or be constructed to have different shapes. The common substrate can comprise an elastomeric layer, which can comprise the same polymer that forms the tips of the tip array, or can comprise an elastomeric polymer that is different from that of the tip array. The elastomeric layer can have a thickness of about 50 μm to about 100 μm. The tip array can be affixed or adhered to a rigid support (e.g., glass, such as a glass slide). In various cases, the common substrate, the tip array, and/or the rigid support, if present, is translucent or transparent. In a specific case, each is translucent or transparent. The thickness of combination of the tip array and common substrate, can be less than about 200 μm, preferably less than about 150 μm, or more preferably about 100 μm.

Patterning Compositions

Patterning compositions suitable for use in the disclosed methods include both homogeneous and heterogeneous compositions, the latter referring to a composition having more than one component. The patterning composition is coated on the tip array. The term "coating," as used herein, refers both to coating of the tip array as well adsorption and absorption by the tip array of the patterning composition. Upon coating of the tip array with the patterning composition, the patterning composition can be patterned on a substrate surface using the tip array.

Patterning compositions can be liquids, solids, semi-solids, and the like. Patterning compositions suitable for use include, but are not limited to, molecular solutions, polymer solutions, pastes, gels, creams, glues, resins, epoxies, adhesives, metal films, particulates, solders, etchants, and combinations thereof.

Patterning compositions can include materials such as, but not limited to, monolayer-forming species, thin film-forming species, oils, colloids, metals, metal complexes, metal oxides, ceramics, organic species (e.g., moieties comprising a carbon-carbon bond, such as small molecules, polymers, polymer precursors, proteins, antibodies, and the like), polymers (e.g., both non-biological polymers and biological polymers such as single and double stranded DNA, RNA, and the like), polymer precursors, dendrimers, nanoparticles, and combinations thereof. In some embodiments, one or more components of a patterning composition includes a functional group suitable for associating with a substrate, for example, by forming a chemical bond, by an ionic interaction, by a Van der Waals interaction, by an electrostatic interaction, by magnetism, by adhesion, and combinations thereof.

In some embodiments, the composition can be formulated to control its viscosity. Parameters that can control ink viscosity include, but are not limited to, solvent composition, solvent concentration, thickener composition, thickener concentration, particles size of a component, the molecular weight of a polymeric component, the degree of cross-linking of a polymeric component, the free volume (i.e., porosity) of a component, the swellability of a component, ionic interactions between ink components (e.g., solvent-thickener interactions), and combinations thereof.

In some embodiments, the patterning composition comprises an additive, such as a solvent, a thickening agent, an ionic species (e.g., a cation, an anion, a zwitterion, etc.) the concentration of which can be selected to adjust one or more of the viscosity, the dielectric constant, the conductivity, the tonicity, the density, and the like.

Suitable thickening agents include, but are not limited to, metal salts of carboxyalkylcellulose derivatives (e.g., sodium carboxymethylcellulose), alkylcellulose derivatives (e.g., methylcellulose and ethylcellulose), partially oxidized alkylcellulose derivatives (e.g., hydroxyethylcellulose, hydroxypropylcellulose and hydroxypropylmethylcellulose), starches, polyacrylamide gels, homopolymers of poly-N-vinylpyrrolidone, poly(alkyl ethers) (e.g., polyethylene oxide, polyethylene glycol, and polypropylene oxide), agar, agarose, xanthan gums, gelatin, dendrimers, colloidal silicon dioxide, lipids (e.g., fats, oils, steroids, waxes, glycerides of fatty acids, such as oleic, linoleic, linolenic, and arachidonic acid, and lipid bilayers such as from phosphocholine) and combinations thereof. In some embodiments, a thickener is present in a concentration of about 0.5% to about 25%, about 1% to about 20%, or about 5% to about 15% by weight of a patterning composition.

Suitable solvents for a patterning composition include, but are not limited to, water, C1-C8 alcohols (e.g., methanol, ethanol, propanol and butanol), C6-C12 straight chain, branched and cyclic hydrocarbons (e.g., hexane and cyclohexane), C6-C14 aryl and aralkyl hydrocarbons (e.g., benzene and toluene), C3-C10 alkyl ketones (e.g., acetone), C3-C10 esters (e.g., ethyl acetate), C4-C10 alkyl ethers, and combinations thereof. In some embodiments, a solvent is present in a concentration of about 1% to about 99%, about 5% to about 95%, about 10% to about 90%, about 15% to about 95%, about 25% to about 95%, about 50% to about 95%, or about 75% to about 95% by weight of a patterning composition.

Patterning compositions can comprise an etchant. As used herein, an "etchant" refers to a component that can react with a surface to remove a portion of the surface. Thus, an etchant is used to form a subtractive feature by reacting with a surface and forming at least one of a volatile and/or soluble material that can be removed from the substrate, or a residue, particulate, or fragment that can be removed from the substrate by, for example, a rinsing or cleaning method. In some embodiments, an etchant is present in a concentration of about 0.5% to about 95%, about 1% to about 90%, about 2% to about 85%, about 0.5% to about 10%, or about 1% to about 10% by weight of the patterning composition.

Etchants suitable for use in the methods disclosed herein include, but are not limited to, an acidic etchant, a basic etchant, a fluoride-based etchant, and combinations thereof. Acidic etchants suitable for use with the present invention include, but are not limited to, sulfuric acid, trifluoromethanesulfonic acid, fluorosulfonic acid, trifluoroacetic acid, hydrofluoric acid, hydrochloric acid, carborane acid, and combinations thereof. Basic etchants suitable for use with the present invention include, but are not limited to, sodium hydroxide, potassium hydroxide, ammonium hydroxide, tetraalkylammonium hydroxide ammonia, ethanolamine, ethylenediamine, and combinations thereof. Fluoride-based etchants suitable for use with the present invention include, but are not limited to, ammonium fluoride, lithium fluoride, sodium fluoride, potassium fluoride, rubidium fluoride, cesium fluoride, francium fluoride, antimony fluoride, calcium fluoride, ammonium tetrafluoroborate, potassium tetrafluoroborate, and combinations thereof.

In some embodiments, the patterning composition includes a reactive component. As used herein, a "reactive component" refers to a compound or species that has a chemical interaction with a substrate. In some embodiments, a reactive component in the ink penetrates or diffuses into the substrate. In some embodiments, a reactive component transforms, binds, or promotes binding to exposed functional groups on the surface of the substrate. Reactive components can include, but are not limited to, ions, free radicals, metals, acids, bases, metal salts, organic reagents, and combinations thereof. Reactive components further include, without limitation, monolayer-forming species such as thiols, hydroxides, amines, silanols, siloxanes, and the like, and other monolayer-forming species known to a person or ordinary skill in the art. The reactive component can be present in a concentration of about 0.001% to about 100%, about 0.001% to about 50%, about 0.001% to about 25%, about 0.001% to about 10%, about 0.001% to about 5%, about 0.001% to about 2%, about 0.001% to about 1%, about 0.001% to about 0.5%, about 0.001% to about 0.05%, about 0.01% to about 10%, about 0.01% to about 5%, about 0.01% to about 2%, about 0.01% to about 1%, about 10% to about 100%, about 50% to about 99%, about 70% to about 95%, about 80% to about 99%, about 0.001%, about 0.005%, about 0.01%, about 0.1%, about 0.5%, about 1%, about 2%, or about 5% weight of the patterning composition.

The patterning composition can further comprise a conductive and/or semi-conductive component. As used herein, a "conductive component" refers to a compound or species that can transfer or move electrical charge. Conductive and semi-conductive components include, but are not limited to, a metal, a nanoparticle, a polymer, a cream solder, a resin, and combinations thereof. In some embodiments, a conductive component is present in a concentration of about 1% to about 100%, about 1% to about 10%, about 5% to about 100%, about 25% to about 100%, about 50% to about 100%, about 75% to about 99%, about 2%, about 5%, about 90%, about 95% by weight of the patterning composition.

Metals suitable for use in a patterning composition include, but are not limited to, a transition metal, aluminum, silicon, phosphorous, gallium, germanium, indium, tin, antimony, lead, bismuth, alloys thereof, and combinations thereof.

In some embodiments, the patterning composition comprises a semi-conductive polymer. Semi-conductive polymers suitable for use with the present invention include, but are not limited to, a polyaniline, a poly(3,4-ethylenedioxythiophene)-poly(styrenesulfonate), a polypyrrole, an arylene vinylene polymer, a polyphenylenevinylene, a polyacetylene, a polythiophene, a polyimidazole, and combinations thereof.

The patterning composition can include an insulating component. As used herein, an "insulating component" refers to a compound or species that is resistant to the movement or transfer of electrical charge. In some embodiments, an insulating component has a dielectric constant of about 1.5 to about 8 about 1.7 to about 5, about 1.8 to about 4, about 1.9 to about 3, about 2 to about 2.7, about 2.1 to about 2.5, about 8 to about 90, about 15 to about 85, about 20 to about 80, about 25 to about 75, or about 30 to about 70. Insulating components suitable for use in the methods disclosed herein include, but are not limited to, a polymer, a metal oxide, a metal carbide, a metal nitride, monomeric precursors thereof, particles thereof, and combinations thereof. Suitable polymers include, but are not limited to, a polydimethylsiloxane, a silsesquioxane, a polyethylene, a polypropylene, a polyimide, and combinations thereof. In some embodiments, for example, an insulating component is present in a concentration of about 1% to about 95%, about 1% to about 80%, about 1% to about 50%, about 1% to about 20%, about 1% to about 10%, about 20% to about 95%, about 20% to about 90%, about 40% to about 80%, about 1%, about 5%, about 10%, about 90%, or about 95% by weight of the patterning composition.

The patterning composition can include a masking component. As used herein, a "masking component" refers to a compound or species that upon reacting forms a surface feature resistant to a species capable of reacting with the surrounding surface. Masking components suitable for use with the present invention include materials commonly employed in traditional photolithography methods as "resists" (e.g., photoresists, chemical resists, self-assembled monolayers, etc.). Masking components suitable for use in the disclosed methods include, but are not limited to, a polymer such as a polyvinylpyrollidone, poly(epichlorohydrin-co-ethyleneoxide), a polystyrene, a poly(styrene-co-butadiene), a poly(4-vinylpyridine-co-styrene), an amine terminated poly(styrene-co-butadiene), a poly(acrylonitrile-co-butadiene), a styrene-butadiene-styrene block copolymer, a styrene-ethylene-butylene block linear copolymer, a polystyrene-block-poly(ethylene-ran-butylene)-block-polystyrene, a poly(styrene-co-maleic anhydride), a polystyrene-block-poly(ethylene-ran-butylene)-block-polystyrene-graft-maleic anhydride, a polystyrene-block-polyisoprene-block-polystyrene, a polystyrene-block-poly(ethylene-ran-butylene)-block-polystyrene, a polynorbornene, a dicarboxy terminated poly(acrylonitrile-co-butadiene-co-acrylic acid), a dicarboxy terminated poly(acrylonitrile-co-butadiene), a polyethyleneimine, a poly(carbonate urethane), a poly(acrylonitrile-co-butadiene-co-styrene), a poly(vinylchloride), a poly(acrylic acid), a poly(methylmethacrylate), a poly(methyl methacrylate-co-methacrylic acid), a polyisoprene, a poly(1,4-butylene terephthalate), a polypropylene, a poly(vinyl alcohol), a poly(1,4-phenylene sulfide), a polylimonene, a poly(vinylalcohol-co-ethylene), a poly[N,N'-(1,3-phenylene)isophthalamide], a poly(1,4-phenylene ether-ether-sulfone), a poly(ethyleneoxide), a poly[butylene terephthalate-co-poly(alkylene glycol)terephthalate], a poly(ethylene glycol)diacrylate, a poly(4-vinylpyridine), a poly(DL-lactide), a poly(3,3',4,4'-benzophenonetetracarboxylic dianhydride-co-4,4'-oxydianiline/1,3-phenylenediamine), an agarose, a polyvinylidene fluoride homopolymer, a styrene butadiene copolymer, a phenolic resin, a ketone resin, a 4,5-difluoro-2,2-bis(trifluoromethyl)-1,3-dioxane, a salt thereof, and combinations thereof. In some embodiments, a masking component is present in a concentration of about 1% to about 10%, about 1% to about 5%, or about 2% by weight of the patterning composition.

The patterning composition can include a conductive component and a reactive component. For example, a reactive component can promote at least one of: penetration of a conductive component into a surface, reaction between the conductive component and a surface, adhesion between a conductive feature and a surface, promoting electrical contact between a conductive feature and a surface, and combinations thereof. Surface features formed by reacting this patterning composition include conductive features selected from the group consisting of: additive non-penetrating, additive penetrating, subtractive penetrating, and conformal penetrating surface features.

The patterning composition can comprise an etchant and a conductive component, for example, suitable for producing a subtractive surface feature having a conductive feature inset therein.

The patterning composition can comprise an insulating component and a reactive component. For example, a reactive component can promote at least one of: penetration of an insulating component into a surface, reaction between the insulating component and a surface, adhesion between an insulating feature and a surface, promoting electrical contact between an insulating feature and a surface, and combinations thereof. Surface features formed by reacting this patterning composition include insulating features selected from the group consisting of: additive non-penetrating, additive penetrating, subtractive penetrating, and conformal penetrating surface features.

The patterning composition can comprise an etchant and an insulating component, for example, suitable for producing a subtractive surface feature having an insulating feature inset therein.

The patterning composition can comprise a conductive component and a masking component, for example, suitable for producing electrically conductive masking features on a surface.

Other contemplated components of a patterning composition suitable for use with the disclosed methods include thiols, 1,9-Nonanedithiol solution, silane, silazanes, alkynes cystamine, N-Fmoc protected amino thiols, biomolecules, DNA, proteins, antibodies, collagen, peptides, biotin, and carbon nanotubes.

For a description of patterning compounds and patterning compositions, and their preparation and use, see Xia and Whitesides, Angew. Chem. Int. Ed., 37, 550-575 (1998) and references cited therein; Bishop et al., Curr. Opinion Colloid & Interface Sci., 1, 127-136 (1996); Calvert, J. Vac. Sci. Technol. B, 11, 2155-2163 (1993); Ulman, Chem. Rev., 96:1533 (1996) (alkanethiols on gold); Dubois et al., Annu. Rev. Phys. Chem., 43:437 (1992) (alkanethiols on gold); Ulman, An Introduction to Ultrathin Organic Films: From Langmuir-Blodgett to Self-Assembly (Academic, Boston, 1991) (alkanethiols on gold); Whitesides, Proceedings of the Robert A. Welch Foundation 39th Conference On Chemical Research Nanophase Chemistry, Houston, Tex., pages 109-121 (1995) (alkanethiols attached to gold); Mucic et al. Chem. Commun. 555-557 (1996) (describes a method of attaching 3' thiol DNA to gold surfaces); U.S. Pat. No. 5,472,881 (binding of oligonucleotide-phosphorothiolates to gold surfaces); Burwell, Chemical Technology, 4, 370-377 (1974) and Matteucci and Caruthers, J. Am. Chem. Soc., 103, 3185-3191 (1981) (binding of oligonucleotides-alkylsiloxanes to silica and glass surfaces); Grabar et al., Anal. Chem., 67, 735-743 (binding of aminoalkylsiloxanes and for similar binding of mercaptoalkylsiloxanes); Nuzzo et al., J. Am. Chem. Soc., 109, 2358 (1987) (disulfides on gold); Allara and Nuzzo, Langmuir, 1, 45 (1985) (carboxylic acids on aluminum); Allara and Tompkins, J. Colloid Interfate Sci., 49, 410-421 (1974) (carboxylic acids on copper); Tier, The Chemistry Of Silica, Chapter 6, (Wiley 1979) (carboxylic acids on silica); Timmons and Zisman, J. Phys. Chem., 69, 984-990 (1965) (carboxylic acids on platinum); Soriaga and Hubbard, J. Am. Chem. Soc., 104, 3937 (1982) (aromatic ring compounds on platinum); Hubbard, Acc. Chem. Res., 13, 177 (1980) (sulfolanes, sulfoxides and other functionalized solvents on platinum); Hickman et al., J. Am. Chem. Soc., 111, 7271 (1989) (isonitriles on platinum); Maoz and Sagiv, Langmuir, 3, 1045 (1987) (silanes on silica); Maoz and Sagiv, Langmuir, 3, 1034 (1987) (silanes on silica); Wasserman et al., Langmuir, 5, 1074 (1989) (silanes on silica); Eltekova and Eltekov, Langmuir, 3,951 (1987) (aromatic carboxylic acids, aldehydes, alcohols and methoxy groups on titanium dioxide and silica); and Lec et al., J. Phys. Chem., 92, 2597 (1988) (rigid phosphates on metals); Lo et al., J. Am. Chem. Soc., 118, 11295-11296 (1996) (attachment of pyrroles to superconductors); Chen et al., J. Am. Chem. Soc., 117, 6374-5 (1995) (attachment of amines and thiols to superconductors); Chen et al., Langmuir, 12, 2622-2624 (1996) (attachment of thiols to superconductors); McDevitt et al., U.S. Pat. No. 5,846,909 (attachment of amines and thiols to superconductors); Xu et al., Langmuir, 14, 6505-6511 (1998) (attachment of amines to superconductors); Mirkin et al., Adv. Mater. (Weinheim, Ger.), 9, 167-173 (1997) (attachment of amines to superconductors); Hovis et al., J. Phys. Chem. B, 102, 6873-6879 (1998) (attachment of olefins and dienes to silicon); Hovis et al., Surf. Sci., 402-404, 1-7 (1998) (attachment of olefins and dienes to silicon); Hovis et al., J. Phys. Chem. B, 101, 9581-9585 (1997) (attachment of olefins and dienes to silicon); Hamers et al., J. Phys. Chem. B, 101, 1489-1492 (1997) (attachment of olefins and dienes to silicon); Hamers et al., U.S. Pat. No. 5,908,692 (attachment of olefins and dienes to silicon); Ellison et al., J. Phys. Chem. B, 103, 6243-6251 (1999) (attachment of isothiocyanates to silicon); Ellison et al., J. Phys. Chem. B, 102, 8510-8518 (1998) (attachment of azoalkanes to silicon); Ohno et al., Mol. Cryst. Liq. Cryst. Sci. Technol., Sect. A, 295, 487-490 (1997) (attachment of thiols to GaAs); Reuter et al., Mater. Res. Soc. Symp. Proc., 380, 119-24 (1995) (attachment of thiols to GaAs); Bain, Adv. Mater. (Weinheim, Fed. Repub. Ger.), 4, 591-4 (1992) (attachment of thiols to GaAs); Sheen et al., J. Am. Chem. Soc., 114, 1514-15 (1992) (attachment of thiols to GaAs); Nakagawa et al., Jpn. J. Appl. Phys., Part 1, 30, 3759-62 (1991) (attachment of thiols to GaAs); Lunt et al., J. Appl. Phys., 70, 7449-67 (1991) (attachment of thiols to GaAs); Lunt et al., J. Vac. Sci. Technol., B, 9, 2333-6 (1991) (attachment of thiols to GaAs); Yamamoto et al., Langmuir ACS ASAP, web release number Ia990467r (attachment of thiols to InP); Gu et al., J. Phys. Chem. B, 102, 9015-9028 (1998) (attachment of thiols to InP); Menzel et al., Adv. Mater. (Weinheim, Ger.), 11, 131-134 (1999) (attachment of disulfides to gold); Yonezawa et al., Chem. Mater., 11, 33-35 (1999) (attachment of disulfides to gold); Porter et al., Langmuir, 14, 7378-7386 (1998) (attachment of disulfides to gold); Son et al., J. Phys. Chem., 98, 8488-93 (1994) (attachment of nitriles to gold and silver); Steiner et al., Langmuir, 8, 2771-7 (1992) (attachment of nitriles to gold and copper); Solomun et al., J. Phys. Chem., 95, 10041-9 (1991) (attachment of nitriles to gold); Solomun et al., Ber. Bunsen-Ges. Phys. Chem., 95, 95-8 (1991) (attachment of nitriles to gold); Henderson et al., Inorg. Chim. Acta, 242, 115-24 (1996) (attachment of isonitriles to gold); Huc et al., J. Phys. Chem. B, 103, 10489-10495 (1999) (attachment of isonitriles to gold); Hickman et al., Langmuir, 8, 357-9 (1992) (attachment of isonitriles to platinum); Steiner et al., Langmuir, 8, 90-4 (1992) (attachment of amines and phospines to gold and attachment of amines to copper); Mayya et al., J. Phys. Chem. B, 101, 9790-9793 (1997) (attachment of amines to gold and silver); Chen et al., Langmuir, 15, 1075-1082 (1999) (attachment of carboxylates to gold); Tao, J. Am. Chem. Soc., 115, 4350-4358 (1993) (attachment of carboxylates to copper and silver); Laibinis et al., J. Am. Chem. Soc., 114, 1990-5 (1992) (attachment of thiols to silver and copper); Laibinis et al., Langmuir, 7, 3167-73 (1991) (attachment of thiols to silver); Fenter et al., Langmuir, 7, 2013-16 (1991) (attachment of thiols to silver); Chang et al., Am. Chem. Soc., 116, 6792-805 (1994) (attachment of thiols to silver); Li et al., J. Phys.

Chem., 98, 11751-5 (1994) (attachment of thiols to silver); Li et al., Report, 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., Langmuir, 7, 955-63 (1991) (attachment of thiols to silver); Walczak et al., J. Am. Chem. Soc., 113, 2370-8 (1991) (attachment of thiols to silver); Sangiorgi et al., Gazz. Chim. Ital., 111, 99-102 (1981) (attachment of amines to copper); Magallon et al., Book of Abstracts, 215th ACS National Meeting, Dallas, Mar. 29-Apr. 2, 1998, COLL-048 (attachment of amines to copper); Patil et al., Langmuir, 14, 2707-2711 (1998) (attachment of amines to silver); Sastry et al., J. Phys. Chem. B, 101, 4954-4958 (1997) (attachment of amines to silver); Bansal et al., J. Phys. Chem. B. 102, 4058-4060 (1998) (attachment of alkyl lithium to silicon); Bansal et al., J. Phys. Chem. B, 102, 1067-1070 (1998) (attachment of alkyl lithium to silicon); Chidsey, Book of Abstracts, 214th ACS National Meeting, Las Vegas, Nev., Sep. 7-11, 1997, I&EC-027 (attachment of alkyl lithium to silicon); Song, J. H., Thesis, University of California at San Diego (1998) (attachment of alkyl lithium to silicon dioxide); Meyer et al., J. Am. Chem. Soc., 110, 4914-18 (1988) (attachment of amines to semiconductors); Brazdil et al. J. Phys. Chem., 85, 1005-14 (1981) (attachment of amines to semiconductors); James et al., Langmuir, 14, 741-744 (1998) (attachment of proteins and peptides to glass); Bernard et al., Langmuir, 14, 2225-2229 (1998) (attachment of proteins to glass, polystyrene, gold, silver and silicon wafers); Pereira et al., J. Mater. Chem., 10, 259 (2000) (attachment of silazanes to $SiO_2$); Pereira et al., J. Mater. Chem., 10, 259 (2000) (attachment of silazanes to $SiO_2$); Dammel, Diazonaphthoquinone Based Resists (1st ed., SPIE Optical Engineering Press, Bellingham, Wash., 1993) (attachment of silazanes to $SiO_2$); Anwander et al., J. Phys. Chem. B, 104, 3532 (2000) (attachment of silazanes to $SiO_2$); Slavov et al., J. Phys. Chem., 104, 983 (2000) (attachment of silazanes to $SiO_2$).

Substrates to be Patterned

Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, films thereof, thin films thereof, laminates thereof, foils thereof, composites thereof, and combinations thereof. A substrate can comprise a semiconductor such as, but not limited to: crystalline silicon, polycrystalline silicon, amorphous silicon, p-doped silicon, n-doped silicon, silicon oxide, silicon germanium, germanium, gallium arsenide, gallium arsenide phosphide, indium tin oxide, and combinations thereof. A substrate can comprise a glass such as, but not limited to, undoped silica glass ($SiO_2$), fluorinated silica glass, borosilicate glass, borophosphorosilicate glass, organosilicate glass, porous organosilicate glass, and combinations thereof. The substrate can be a non-planar substrate, such as pyrolytic carbon, reinforced carbon-carbon composite, a carbon phenolic resin, and the like, and combinations thereof. A substrate can comprise a ceramic such as, but not limited to, silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, such as, but not limited to: a plastic, a metal, a composite thereof, a laminate thereof, a thin film thereof, a foil thereof, and combinations thereof.

Leveling of the Tip Array and Deposition of Patterning Composition onto Substrate Surface The disclosed methods provide the ability for in situ imaging capabilities, similar to scanning probe microscope-based lithography methods (e.g., dip pen lithography) as well as the ability to pattern a feature in a fast fashion, similar to microcontact printing. The features that can be patterned range from sub-100 nm to 1 mm in size or greater, and can be controlled by altering the contacting time and/or the contacting pressure of the tip array. Similar to DPN, the amount of patterning composition (as measured by feature size) deposited onto a substrate surface is proportional to the contacting time, specifically a square root correlation with contacting time, see FIG. 6. Unlike DPN, the contacting pressure of the tip array can be used to modify the amount of patterning composition that can be deposited onto the substrate surface. The pressure of the contact can be controlled by the z-piezo of a piezo scanner, see FIG. 2B. The more pressure (or force) exerted on the tip array, the larger the feature size. Thus, any combination of contacting time and contacting force/pressure can provide a means for the formation of a feature size from about 30 nm to about 1 mm or greater. The ability to prepare features of such a wide range of sizes and in a "direct writing" or in situ manner in milliseconds makes the disclosed lithography method adaptable to a host of lithography applications, including electronics (e.g., patterning circuits) and biotechnology (e.g., arraying targets for biological assays). The contacting pressure of the tip array can be about 10 MPa to about 300 MPa.

At very low contact pressures, such as pressures of about 0.01 to about 0.1 $g/cm^2$ for the preferred materials described herein, the feature size of the resulting indicia is independent of the contacting pressure, which allows for one to level the tip array on the substrate surface without changing the feature size of the indicia. Such low pressures are achievable by 0.5 µm or less extensions of the z-piezo of a piezo scanner to which a tip array is mounted, and pressures of about 0.01 $g/cm^2$ to about 0.1 $g/cm^2$ can be applied by z-piezo extensions of less than 0.5 µm. This "buffering" pressure range allows one to manipulate the tip array, substrate, or both to make initial contact between tips and substrate surface without compressing the tips, and then using the degree of compression of tips (observed by changes in reflection of light off the inside surfaces of the tips) to achieve a uniform degree of contact between tips and substrate surface. This leveling ability is important, as non-uniform contact of the tips of the tip array can lead to non-uniform indicia. Given the large number of tips of the tip array (e.g., 11 million in an example provided herein) and their small size, as a practical matter it may be difficult or impossible to know definitively if all of the tips are in contact with the surface. For example, a defect in a tip or the substrate surface, or an irregularity in a substrate surface, may result in a single tip not making contact while all other tips are in uniform contact. Thus, the disclosed methods provide for at least substantially all of the tips to be in contact with the substrate surface (e.g., to the extent detectable). For example, at least 90%, at least 95%, at least 96%, at least 97%, at least 98%, or at least 99% of the tips will be in contact with the substrate surface.

The leveling of the tip array and substrate surface with respect to one another can be assisted by the fact that with a transparent, or at least translucent, tip array and common substrate arrangement, one can observe the change in reflection of light that is directed from the top of the tip array (i.e., behind the base of the tips and common substrate) through to the substrate surface. The intensity of light reflected from the tips of the tip array gets greater upon contact with the substrate surface (e.g., the internal surfaces of the tip array reflect light differently upon contact). By observing the change in reflection of light at each tip, one can adjust the tip array and/or the substrate surface to effect contact of substantially all or all of the tips of the tip array to the substrate surface. Thus, the tip array and common substrate preferably are translucent or transparent to allow for observing the change in light reflection of the tips upon contact with the substrate surface. Likewise, any rigid backing material to which the tip array is mounted is also preferably at least transparent or translucent.

The contacting time for the tips can be from about 0.001 s to about 60 s, depending upon the amount of patterning composition desired in any specific point on a substrate surface. The contacting force can be controlled by altering the z-piezo of the piezo scanner or by other means that allow for controlled application of force across the tip array.

The substrate surface can be contacted with a tip array a plurality of times, wherein the tip array, the substrate surface or both move to allow for different portions of the substrate surface to be contacted. The time and pressure of each contacting step can be the same or different, depending upon the desired pattern. The shape of the indicia or patterns has no practical limitation, and can include dots, lines (e.g., straight or curved, formed from individual dots or continuously), a preselected pattern, or any combination thereof.

The indicia resulting from the disclosed methods have a high degree of sameness, and thus are uniform or substantially uniform in size, and preferably also in shape. The individual indicia feature size (e.g., a dot or line width) is highly uniform, for example within a tolerance of about 5%, or about 1%, or about 0.5%. The tolerance can be about 0.9%, about 0.8%, about 0.7%, about 0.6%, about 0.4%, about 0.3%, about 0.2%, or about 0.1%. Non-uniformity of feature size and/or shape can lead to roughness of indicia that can be undesirable for sub-micron type patterning.

The feature size can be about 10 nm to about 1 mm, about 10 nm to about 500 µm, about 10 nm to about 100 µm, about 50 nm to about 100 µm, about 50 nm to about 50 µm, about 50 nm to about 10 µm, about 50 nm to about 5 µm, or about 50 nm to about 1 µm. Features sizes can be less than 1 µm, less than about 900 nm, less than about 800 nm, less than about 700 nm, less than about 600 nm, less than about 500 nm, less than about 400 nm, less than about 300 nm, less than about 200 nm, less than about 100 nm, or less than about 90 nm.

EXAMPLES

Fabrication of Masters of Polymer Pen Arrays

Shipley1805 (MicroChem, Inc.) photoresist was spin-coated onto gold thin film substrates (10 nm Cr adhesion layer with 100 nm of Au thermally evaporated on a pre-cleaned oxidized Si <100> wafer). Square well arrays were fabricated by photolithography using a chrome mask. The photoresist patterns were developed in an MF319 developing solution (MicroChem, Inc.), and then exposed to $O_2$ plasma for 30 s (200 mTorr) to remove the residual organic layer. Subsequently, the substrates were placed in gold (Type TFA, Transene) and chromium (Type 1020, Transene) etching solutions, respectively. Copious rinsing with MiliQ water was required after each etching step to clean the surface. The photoresist was then washed away with acetone to expose the gold pattern. The gold patterned substrate was placed in a KOH etching solution (30% KOH in $H_2O$:IPA (4:1 v/v)) at 75° C. for ~25 min with vigorous stirring. The uncovered areas of the Si wafer were etched anisotropically, resulting in the formation of recessed pyramids. The remaining Au and Cr layers were removed by wet chemical etching. Finally, the pyramid master was modified with 1H,1H,2H,2H-perfluoro-decyltrichlorosilane (Gelest, Inc.) by gas phase silanization.

Fabrication of Polymer Pen Array:

Hard PDMS (h-PDMS) (1,2) was used for fabricating the polymer pen arrays. The h-PDMS was composed of 3.4 g of vinyl-compound-rich prepolymer (VDT-731, Gelest) and 1.0 g of hydrosilane-rich crosslinker (HMS-301). Preparation of polymers typically required the addition of 20 ppm w/w platinum catalyst to the vinyl fraction (platinumdivinyltetramethyldisiloxane complex in xylene, SIP 6831.1 Gelest) and 0.1% w/w modulator to the mixture (2,4,6,8-tetramethyltetravinylcyclotetrasiloxane, Fluka). The mixture was stirred, degassed, and poured on top of the polymer pen array master. A pre-cleaned glass slide (VWR, Inc.) was then placed on top of the elastomer array and the whole assembly was cured at 70° C. overnight. The polymer pen array was carefully separated from the pyramid master and then used for lithography experiments. The procedure for preparing the pen arrays is shown in FIG. 1A.

Figure 7:
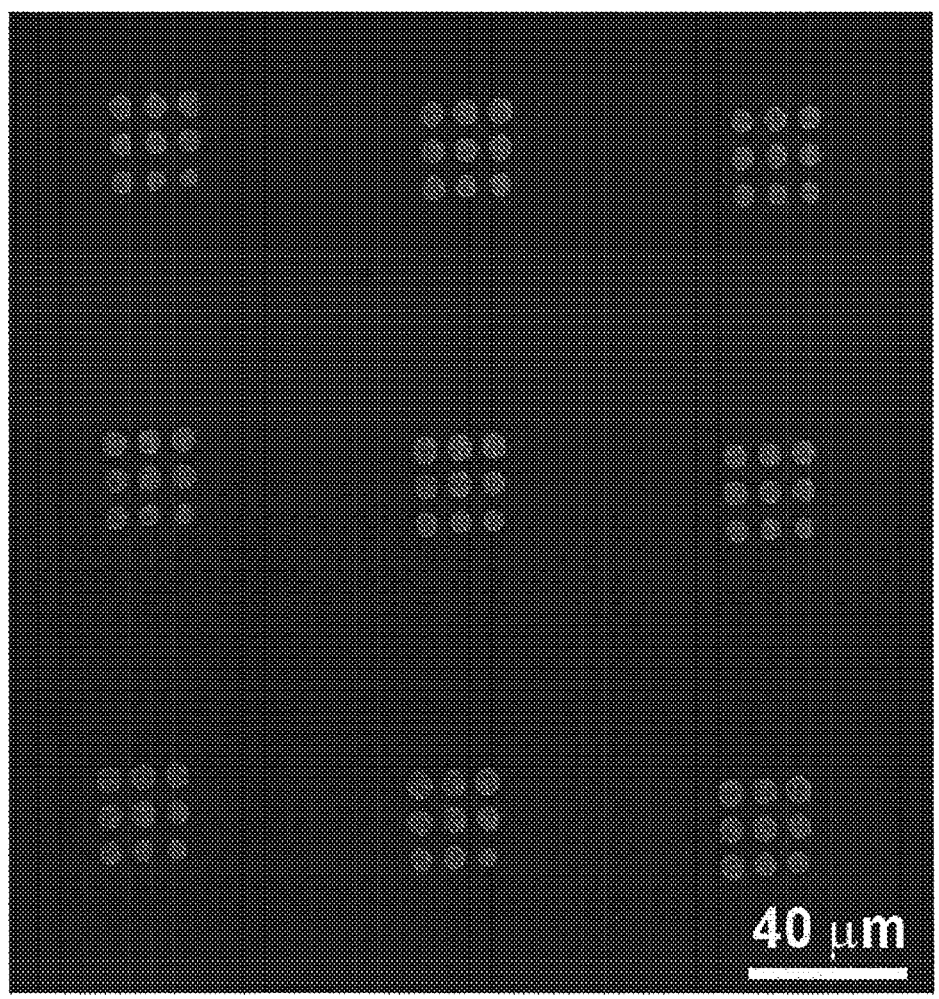
FIG. 7. Fluorescence microscopy image of Anti-Mouse IgG arrays fabricated by Polymer Pen Lithography.
Figure 8:
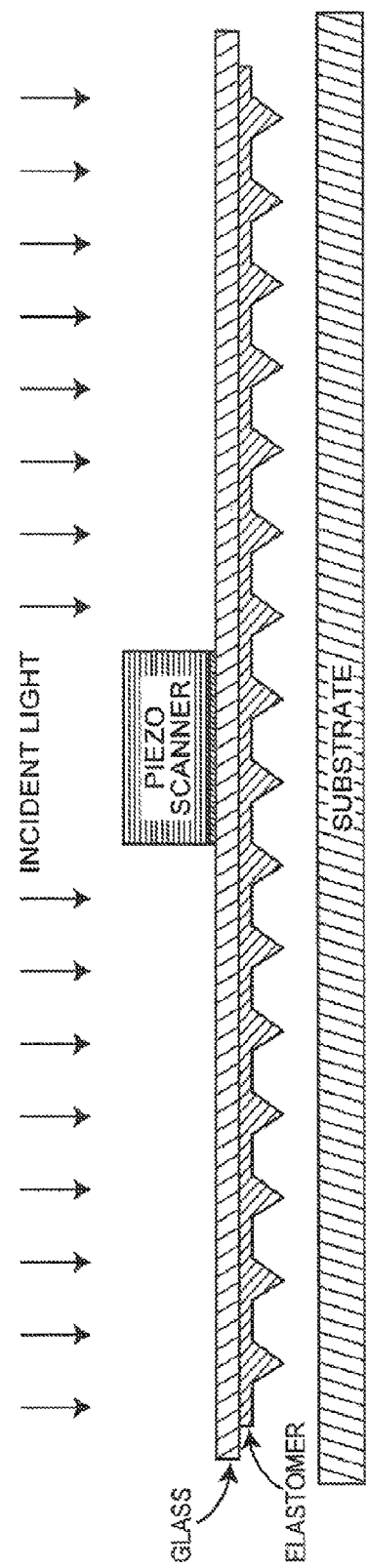
FIG. 8. A schematic illustration of the set up of tip array, piezo scanner, and substrate surface, in relation to a light source, used for leveling the tip array with respect to the substrate surface.

Patterning of Protein Arrays by Polymer Pen Lithography:

Tetramethylrhodamine 5-(and -6)-isothiocyanate (TRITC) conjugated anti-mouse IgG arrays were generated on a Codelink™ glass slide (GE Healthcare) by Polymer Pen Lithography. In a typical experiment, the polymer pen array was modified with polyethylene glycol silane (PEG-silane) to minimize non-specific interactions between the protein and PDMS surface. To effect surface modification, the polymer pen array was briefly exposed to an oxygen plasma (30 sec) to render the surface hydrophilic. Subsequently, it was immersed in a 1 mM aqueous solution of PEG-silane (pH 2, MW 2,000, Rapp Polymere, Germany) for 2 hr, cleaned with deionized water, and then blown dry with $N_2$. An aqueous solution consisting of 50 mg/ml glycerol and 5 mg/ml TRITC conjugated IgG was then spincoated onto the PEG-silane modified polymer pen array (1,000 rpm for 2 min), and the pen array was used to generate protein arrays on Codelink™ slides. The pen array was leveled by monitoring the tip array through the glass slide support. When a tip made contact with the substrate surface, the amount of light reflected from the tip increased significantly, allowing for easy monitoring of when all or a substantial number of the tips were in contact with the substrate surface (e.g., when the tip array was "leveled"). The patterning environment was maintained at 20° C. and 70% relative humidity. After the Polymer Pen Lithography process, the Codelink™ slide was incubated in a humidity chamber overnight, and rinsed with 0.02% sodium dodecyl sulfate to remove physisorbed material. FIG. 7 shows the fluorescent image of the as generated 3×3 IgG arrays. Each IgG dot was made by contacting the tip array with the substrate for 3 seconds. The size of each IgG dot was 4±0.7 µm.

The foregoing describes and exemplifies the invention but is not intended to limit the invention defined by the claims which follow. All of the methods disclosed and claimed herein can be made and executed without undue experimentation in light of the present disclosure. While the materials and methods of this invention have been described in terms of specific embodiments, it will be apparent to those of skill in the art that variations may be applied to the materials and/or methods and in the steps or in the sequence of steps of the methods described herein without departing from the concept, spirit and scope of the invention. More specifically, it will be apparent that certain agents which are both chemically and physiologically related may be substituted for the agents described herein while the same or similar results would be achieved.

All patents, publications and references cited herein are hereby fully incorporated by reference. In case of conflict between the present disclosure and incorporated patents, publications and references, the present disclosure should control.

REFERENCES

1. C. A. Mirkin, *ACS Nano* 1, 79 (2007).
2. K. Salaita, et al., *Nat. Nanotech.* 2, 145 (2007).
3. D. S. Ginger, et al., *Angew. Chem. Int. Ed.* 43, 30 (2004).
4. Y. Xia, G. M. Whitesides, *Angew. Chem. Int. Ed.* 37, 551 (1998).
5. Y. Xia, G. M. Whitesides, *Ann. Rev. Mater. Sci.* 28, 153 (1998).
6. M. Qi et al., *Nature* 429, 538 (2004).
7. T. Ito, S Okazaki, *Nature* 406, 1027 (2000).
8. Y. L. Loo, et al., *J. Am. Chem. Soc.* 124, 7654 (2002).
9. Z. Zheng, et al., *J. Am. Chem. Soc.* 128, 7730 (2006).
10. A. Kumar, G. M. Whitesides, *Appl. Phys. Lett.* 63, 2002 (1993).
11. M. N. Yousaf, et al., *Proc. Natl. Acad. Sci.* 98, 5992 (2001).
12. S. Y. Chou, et al., *Science* 272, 85 (1996).
13. S. Xu, et al., *Langmuir* 15, 7244 (1999).
14. M. Geissler, Y. Xia, *Adv. Mater.* 16, 1249 (2004).
15. B. D. Gates et al., *Chem. Rev.* 105, 1171 (2005).
16. R. D. Piner, et al., *Science* 283, 661 (1999).
17. S. Kramer, et al., *Chem. Rev.* 103, 4367 (2003).
18. R. Maoz, et al., *Adv. Mater.* 11, 55 (1999).
19. S. Lenhert, et al., *Small* 3, 71 (2007).
20. K. Salaita et al., *Angew. Chem. Int. Ed.* 45, 7220 (2006).
21. S. Hong, C. A. Mirkin, *Science* 288, 1808 (2000).
22. L. M. Demers et al., *Science* 296, 1836 (2002).
23. K.-B. Lee, et al., *Science* 295, 1702 (2002).
24. For instance, DPN fabrication of a 10 µm×10 µm MHA feature on a gold substrate with a conventional $Si_3N_4$ cantilever (radius of curvature=20-60 nm) takes approximately 30 minutes.
25. E. Delamarche et al., *Langmuir* 19, 8749 (2003).
26. T. W. Odom, et al., *Langmuir* 18, 5314 (2002).
27. H. Zhang, et al., *Nano Lett.* 4, 1649 (2004).
28. X. Wang et al., *Langmuir* 19, 8951 (2003).

What is claimed is:

1. A method for sub-micron scale printing of indicia on a substrate surface, comprising:
    coating a tip array with a patterning composition, the tip array comprising a compressible elastomeric polymer comprising a plurality of non-cantilevered tips each having a radius of curvature of less than about 1 µm and a common substrate comprising a compressible elastomeric polymer, the tip array and the common substrate mounted onto a rigid support and the tip array, common substrate, and rigid support together being at least translucent;
    contacting the substrate surface for a first contacting period of time and at a first contacting pressure with all or substantially all of the coated tips of the array to deposit the patterning composition onto the substrate surface and form substantially uniform indicia with all or substantially all of said coated tips, the indicia having a dot size (or line width) of less than 1 µm.

2. The method of claim 1, wherein the tip array comprises a plurality of tips arranged in a regular periodic pattern.

3. The method of claim 1, wherein each tip has a radius of curvature of less than about 0.2 µm.

4. The method of claim 1, wherein the polymer has a compression modulus of about 10 MPa to about 300 MPa.

5. The method of claim 1, wherein the polymer is crosslinked.

6. The method of claim 1, wherein the polymer comprises polydimethylsiloxane (PDMS).

7. The method of claim 6, wherein the PDMS comprises a trimethylsiloxy terminated vinylmethylsiloxane-dimethysiloxane copolymer, a methylhydrosiloxane-dimethylsiloxane copolymer, or a mixture thereof.

8. The method of claim 1, wherein each tip of the tip array is identically-shaped.

9. The method of claim 8, wherein the tip shape is pyramidal.

10. The method of claim 1, wherein the coating comprises adsorbing or absorbing the patterning composition onto the tip array.

11. The method of claim 1, further comprising moving the tip array, the substrate surface, or both and repeating the contacting step for a second contacting period of time and at a second contacting pressure.

12. The method of claim 11, wherein the first contacting period of time and the second contacting period of time are equal.

13. The method of claim 11, wherein the first contacting period of time and the second contacting period of time are different.

14. The method of claim 11, wherein the first contacting pressure and the second contacting pressure are the same.

15. The method of claim 11, wherein the first contacting pressure and the second contacting pressure are different.

16. The method of claim 11, comprising moving the tip array and holding the substrate surface stationary.

17. The method of claim 11, comprising holding the tip array stationary and moving the substrate surface.

18. The method of claim 11, comprising moving both the tip array and the substrate surface.

19. The method of claim 1, further comprising controlling a z-piezo of a piezo scanner upon which the substrate or the tip array is mounted to control the contacting pressure.

20. The method of claim 1, comprising limiting lateral movement between the tip array and the substrate to form indicia comprising dots.

21. The method of claim 20, comprising controlling the contacting period of time, the contacting pressure, or both to form the dots with a diameter in a range of about 10 nm to about 500 µm.

22. The method of claim 1, comprising controlling lateral movement between the tip array and the substrate surface during contacting and/or between one or more sets of contacting and depositing steps to form indicia comprising one or more of lines and a preselected pattern.

23. The method of claim 1, comprising selecting for the tip array a compressible polymer which is Hookean under pressures of 10 MPa to 300 MPa.

24. The method of claim 1, comprising contacting each tip of the tip array with the substrate surface.

25. The method of claim 1, wherein the indicia have a dot size (or line width) of less than 900 nm.

26. The method of claim 1, wherein the indicia have a dot size (or line width) of less than 100 nm.

27. The method of claim 1, further comprising leveling the tips of the tip array with respect to the substrate surface by backlighting the tip array with incident light to cause internal reflection of the incident light from the internal surfaces of the tips;

bringing the tips of the tip array and the substrate surface together along a z-axis up to a point of contact between a subset of the tips with the substrate surface, contact indicated by increased intensity of reflected light from the subset of tips in contact with the substrate surface, whereas no change in the intensity of reflected light from other tips indicates non-contacting tips; and tilting one or both of the tip array and the substrate surface with respect to the other in response to differences in intensity of the reflected light from the internal surfaces of the tips, to achieve contact between the substrate surface and non-contacting tips, wherein said tilting is performed one or more times along x-, y-, and/or z-axes.

28. The method of claim 1, further comprising leveling the tips of the tip array with respect to the substrate surface by backlighting the tip array with incident light to cause internal reflection of the incident light from the internal surfaces of the tips;

bringing the tips of the tip array and the substrate surface together along a z-axis to cause contact between the tips of the tip array and the substrate surface;

further moving one or both of the tip array and the substrate towards the other along the z-axis to compress a subset of the tips, whereby the intensity of the reflected light from the tips increases as a function of the degree of compression of the tips against the substrate surface; and tilting one or both of the tip array and the substrate surface with respect to the other in response to differences in intensity of the reflected light from internal surfaces of the tips, to achieve substantially uniform contact between the substrate surface and tips, wherein said tilting is performed one or more times along x-, y- and/or z-axes.

29. The method of claim 1, wherein the tip array has a pen density of $100/cm^2$ to $250,000/cm^2$.

30. The method of claim 1, wherein the tip array has 1000 tips to 15 million tips.

31. The method of claim 30, wherein the tip array has greater than 1 million tips.

32. The method of claim 1, wherein the indicia have a dot size (or line width) of less than 600 nm.

* * * * *